United States Patent [19]
Limberg

[11] Patent Number: 5,982,457
[45] Date of Patent: Nov. 9, 1999

[54] RADIO RECEIVER DETECTING DIGITAL AND ANALOG TELEVISION RADIO-FREQUENCY SIGNALS WITH SINGLE FIRST DETECTOR

[75] Inventor: Allen LeRoy Limberg, Fairfax County, Va.

[73] Assignee: Samsung Electronics, Co. Ltd., Suwon, Rep. of Korea

[21] Appl. No.: 08/825,711

[22] Filed: Mar. 19, 1997

Related U.S. Application Data

[60] Provisional application No. 60/034,610, Jan. 7, 1997.

[51] Int. Cl.$^6$ ........................................... H04N 5/44
[52] U.S. Cl. ........................... 348/725; 348/725; 348/554; 348/555; 348/558
[58] Field of Search ................................... 348/554, 555, 348/558, 721, 726, 725

[56] References Cited

U.S. PATENT DOCUMENTS

| | | | |
|---|---|---|---|
| 4,984,081 | 1/1991 | Miyoshi et al. | 358/180 |
| 5,132,793 | 7/1992 | Hirahata et al. | 358/140 |
| 5,173,774 | 12/1992 | Bretl et al. | 358/140 |
| 5,283,653 | 2/1994 | Citta | 348/725 |
| 5,361,099 | 11/1994 | Kim | 348/555 |
| 5,461,427 | 10/1995 | Duffield et al. | 348/555 |
| 5,557,337 | 9/1996 | Scarpa | 348/558 |

*Primary Examiner*—John K. Peng
*Assistant Examiner*—Paulos M. Natnael
*Attorney, Agent, or Firm*—Samsung Electronics, Co, Ltd.

[57] ABSTRACT

Radio receivers for receiving DTV signals, in accordance with the Advanced Television Systems Committee (ATSC) standard, or analog TV, in accordance with the National Television Sub-Committee (NTSC) standard, each use a single first detector for both types of signal. This single first detector supplies its output signals to an intermediate-frequency amplifier chain for TV signals and to another intermediate-frequency amplifier chain for analog TV signals. The response of the IF amplifier chain for DTV signals is synchrodyned to baseband, supplied to symbol decoding circuitry, and used by first automatic gain control circuitry to develop AGC for amplifier stages in that IF amplifier chain when DTV signals are received. The response of the IF amplifier chain for analog TV signals is supplied to a video detector, and second automatic gain control circuitry develops AGC for amplifier stages in that IF amplifier chain from the composite video signal reproduced by the video detector when analog TV signals are received. In some of the radio receivers the sound carrier of the NTSC signal has a separate, further intermediate-frequency amplifier chain. The absence of 4.5 MHz intercarrier sound is detected when DTV signals are received to automatically fine tune the first detector in response to pilot carrier and to obtain delayed AGC for the radio-frequency amplifier from the first AGC circuitry. The presence of intercarrier sound is detected when analog TV signals are received, to automatically fine tune the first detector in response to video carrier and to obtain delayed AGC for the radio-frequency amplifier from the second AGC circuitry.

56 Claims, 9 Drawing Sheets

RADIO RECEIVER DETECTING DIGITAL AND ANALOG TELEVISION RADIO-FREQUENCY SIGNALS WITH SINGLE FIRST DETECTOR

This is a complete application filed under 35 U.S.C. 111(a) claiming, pursuant to 35 U.S.C. 119(e)(1), benefit of the filing date of provisional application Ser. No. 60/034,610 filed Jan. 7, 1997, pursuant to 35 U.S.C. 111(b).

The present invention relates to the radio receiver portions of television (TV) signal receivers for receiving terrestrial through-the-air television broadcasting in the United States of America whether the received signals be digital television signals, in accordance with the Advanced Television Systems Committee (ATSC) standard, or analog television signals, in accordance with the National Television Sub-Committee (NTSC) standard.

BACKGROUND OF THE INVENTION

The first detector in a television signal receiver converts radio-frequency (RF) signals in a selected one of the television broadcast channels, which channels occupy various 6-MHz-wide portions of the electromagnetic wave frequency spectrum, to intermediate-frequency (IF) signals in one particular 6-MHz-wide portion of that spectrum. This conversion is typically carried out by superheterodyning the RF signals, which is to say mixing the RF signals with local oscillations from an oscillator oscillating at a frequency substantially higher than the frequencies in the television channel of highest frequency. The first detector is used to convert a selected RF signal to IF signal in order that up to 60 dB or more amplification can be done in that particular 6-MHz-wide portion of that spectrum using intermediate-frequency amplifiers with fixed, rather than variable, tuning. Amplification of the received signals is necessary to raise them to power levels required for further signal detection operations, such as video detection and sound detection in the case of analog TV signals, and such as symbol decoding in the case of digital TV signals. The first detector usually includes variable tuning elements in the form of preselection filter circuitry for the RF signals to select among the various 6-MHz-wide television channels and in the further form of elements for determining the frequency of the local oscillations used for super-heterodyning the RF signals. In TV receivers of more recent design the local oscillator signals are often generated using a frequency synthesizer in which the local oscillator signals are generated with frequency regulated in adjustable ratio with the fixed frequency of a standard oscillator.

Television signal receivers for receiving digital television (DTV) signals that have been described in the prior art use plural-conversion radio receivers wherein DTV signal in a selected one of the ultra-high-frequency (UHF) channels is first up-converted in frequency to first intermediate-frequency signal in a first intermediate-frequency band centered at 920 MHz for amplification in a first intermediate-frequency amplifier. The resulting amplified first intermediate-frequency signal is then down-converted in frequency by mixing it with 876 MHz local oscillations, resulting in a second intermediate-frequency signal. This second intermediate-frequency signal, in a second intermediate-frequency band centered at 44 MHz, is then amplified in a second intermediate-frequency amplifier. The response of the second intermediate-frequency amplifier is then synchrodyned to baseband in DTV signal receivers developed by the Grand Alliance.

Radio receivers for receiving DTV signals, in which receivers the final intermediate-frequency signal is somewhere in the 1–8 MHz frequency range, are described by C. B. Patel and the inventor in U.S. Pat. No. 5,479,449 issued Dec. 26, 1995, entitled "DIGITAL VSB DETECTOR WITH BANDPASS PHASE TRACKER, AS FOR INCLUSION IN AN HDTV RECEIVER", and included herein by reference. The radio receivers specifically described in U.S. Pat. No. 5,479,449 are of triple-conversion type using a 920 MHz analog IF amplifier for first detector response, the first detector being an up-converter, and using a 44 MHz analog IF amplifier for second detector response, the second detector being a down-converter. A third detector is a further down-converter, generating a 1–8 MHz final IF signal as third detector response. This final IF signal is not amplified, but is digitized by an analog-to-digital converter for use in digital circuitry for synchrodyning to baseband. The resulting digital baseband signal is equalized and then data-sliced in a symbol decoder. The first intermediate-frequency amplifier in one of the DTV signal receivers described in U.S. Pat. No. 5,479,449 uses a surface-acoustic wave (SAW) filter for establishing the bandwidth of the 920 MHz IF amplifier.

The DTV signal receiver developed by the Grand Alliance is of double-conversion type using a 920 MHz analog IF amplifier for first detector response, the first detector being an up-converter, and using a 44 MHz analog IF amplifier for second detector response, the second detector being a down-converter. The amplified response of the 44 MHz analog IF amplifier is the final IF signal, which is synchrodyned to baseband in the analog regime. The resulting analog baseband response is then digitized by an analog-to-digital converter prior to being equalized and then data-sliced in a symbol decoder. The first intermediate-frequency amplifier in The DTV signal receiver developed by the Grand Alliance uses ceramic resonators for establishing the bandwidth of the 920 MHz IF amplifiers.

For a period of years while DTV broadcasting is becoming established, it is planned that the broadcasting of analog TV signals will continue in the United States in accordance with the NTSC standard using the same UHF channels as DTV signals as well as other channels in the VHF and UHF bands. While analog and digital TV signals occupy the same television channels, the requirements of radio receivers for the two types of TV signal are not particularly compatible. Accordingly, there are good reasons for using separate radio receivers for analog TV signals and for digital TV signals in a system designed to receive both types of TV signal.

A reason for using separate radio receivers for analog TV signals and for digital TV signals that will be quite apparent to an electronics design engineer reviewing the systems standards for the two types of TV signals concerns the different radio receiver passbands for each type of TV signal. In an analog TV signal the video carrier is located at a frequency 1.25 MHz above the lower limit frequency of the TV channel, and the vestigial sideband exhibits no gain reduction vis-a-vis the full sideband until modulating frequencies exceed 750 kHz. Accordingly, the radio receiver for an analog TV signal customarily exhibits a linear roll-off of the overall intermediate-frequency response supplied to the video detector, which roll-off is down 6 dB at the video carrier frequency and provides for an overall flat baseband video response up to 4.2 MHz or so. In a DTV signal, the data is located at a frequency only 310 kHz above the lower limit frequency of the TV channel, and roll-off down 6 dB at the data carrier frequency is provided at the transmitter, rather than at the receiver. The overall intermediate-frequency response is essentially flat over a frequency band 6 MHz-wide between 1-dB-down limit frequencies in Grand Alliance receiver designs published by Zenith Radio Corporation.

A radio receiver for an analog TV signal customarily uses a trap filter for removing frequency-modulated (FM) sound carrier from the IF signal supplied the video detector. This is necessary to suppress a 920 kHz beat between the FM sound carrier and the amplitude-modulated chrominance subcarrier, which beat causes unwanted variation in the luminance component of the composite video signal recovered by the video detector. This luminance variation is obtrusively apparent when viewing images reproduced on a television viewscreen. Sound trap filters have not been used in prior-art DTV receiver designs, though co-channel interfering NTSC signals are a known problem during HDTV reception. The avoidance of trap filtering in the IF amplifiers of a DTV signal receiver makes it easier to maintain phase linearity throughout the IF passband.

A more subtle reason for using separate radio receivers for analog TV signals and for digital TV signals, of which one of ordinary skill in the art of design of just one of these types of radio receiver is probably unaware, is the difference in preferred designs of automatic gain control (AGC) for the radio receiver portions of analog TV signal receivers and of DTV signal receivers.

The power in an analog TV signal must be quite high in order that accompanying Johnson or galactic noise is low enough in amplitude as not to cause "snow" (luminance noise) in a black-and-white TV picture or "colored snow" (luminance plus chrominance noise) in a color TV picture. The effective radiated power from an analog TV transmitter is typically tens of kilowatts. The IF amplifier chain in an analog TV signal receiver typically provides maximum gain of 60 to 90 dB, which can be reduced responsive to automatic gain control (AGC). Gain reduction of as much as 66 dB is required to handle the gamut of usable signal strengths. When receiving analog TV signals, this gain reduction is preferably obtained using forward AGC in at least the earlier IF amplifier stages. This avoids the problem of internally generated noise in the IF amplifier stages rising vis-a-vis Johnson noise to adversely affect overall noise figure for the radio receiver, which problem is encountered when using reverse AGC. The great concern with loss in noise figure when receiving analog TV signals arises because the human eye is quite sensitive to the presence of random noise accompanying the composite video signal from the video detector. The amplitude of the luminance signal component of the composite video signal directly controls the intensity of light emanating from or reflected from the television display device, and the amplitudes of the chrominance signal component of the composite video signal directly affect the hue and color saturation of that light.

In a DTV receiver the radio receiver portion thereof supplies plural-level symbol codes as baseband output signal, and the light emanating from or reflected from the television display device is not directly controlled by the amplitude of such baseband output signal. Small amounts of random noise are strongly rejected by quantizing effects in the data-slicing and trellis decoding associated with symbol decoding. Consequently, the overall noise figure for the radio receiver becomes of concern chiefly when distinguishing between the various levels of the symbol codes becomes a problem. In order best to facilitate distinguishing between the various levels of the symbol codes, linearity of the baseband output signal detected by the radio receiver becomes an important concern, and there is less concern for the overall noise figure for the radio receiver unless long-distance reception of DTV signals is sought for transmissions with power levels in the few hundreds of watts.

The AGC of IF amplifier stages in a DTV signal receiver must be such as to avoid non-linearity. Forward AGC tends to introduce non-linearity into the modulation of the IF signal. The resulting distortion is generally tolerable in analog TV signal reception, since larger amplitude modulation properly occurs primarily during synchronizing pulses, and since luminance signal varies in inverse logarithmic relation to scene brightness. Reverse AGC that does not introduce non-linearities into the modulation of the IF signal can be designed for a DTV signal receiver. This can be done using variable-resistance emitter degeneration in a common-emitter transistor amplifier, for example. Or, by way of further example, the collector current of a common-emitter transistor amplifier can be split using common-base transistor amplifiers connected at their emitter electrodes to form a variable-transconductance multiplier. The loss in noise figure with reduction of gain in such reverse AGC arrangements presents little problem as long as overall noise internally generated within the IF amplifier chain of the DTV receiver is smaller than the smallest transitions between digital modulation levels in the final IF amplifier output signal.

The inventor points out that the cost of a first detector is substantial enough that it is undesirable to use separate first detectors for analog TV signals and for digital TV signals in radio receivers designed to receive both types of signal, whether those radio receivers are included in a TV set complete with viewscreen or in a digital recording apparatus, such as one using magnetic tape as a recording medium. The use of a single first detector for both analog rv signals and digital TV signals is also desirable in that it allows more compact radio receiver design and at the same time avoids any problems of unwanted radiation from the output of one of separate respective first detectors for analog TV signals and for digital TV signals to the other first detector.

SUMMARY OF THE INVENTION

A radio receiver for receiving DTV signals, in accordance with the Advanced Television System Committee (ATSC) standard, or analog TV, in accordance with the National Television Sub-Committee (NTSC) standard, embodies a principal aspect of the invention by using a single first detector for both types of signal, but separate arrangements for amplifying the response of this single first detector to each of these types of signal. The single first detector supplies its output signals to an intermediate-frequency amplifier chain for DTV signals and to another intermediate-frequency amplifier chain for analog TV signals. The response of the intermediate-frequency amplifier chain for DTV signals is synchrodyned to baseband and supplied to symbol decoding circuitry. The response of the intermediate-frequency amplifier chain for analog TV signals is supplied to a video detector. Preferably, the IF amplifier chain for DTV signals employs amplifier stages subject to reverse AGC which maintains linearity of gain despite reduced gain, and the IF amplifier chain for analog TV signals employs amplifier stages at least an earlier one of which is subject to forward AGC which maintains good noise figure despite reduced gain. In receivers which are constructed in accordance with the invention and use a radio-frequency amplifier before the first detector, overloading of a first mixer in the first detector on strong signals is avoided by delayed reverse AGC of the RF amplifier.

In another aspect of the invention, embodied in certain radio receivers that also embody the principal aspect of the invention, video carrier or pilot carrier extracted from the intermediate-frequency amplifier chain for DTV signals is used for automatic fine tuning of the single first detector.

In a further aspect of the invention, embodied in certain radio receivers that also embody the principal aspect of the invention, video carrier extracted from the intermediate-frequency amplifier chain for DTV signals is used in the production of intercarrier sound intermediate-frequency signals from response of the intermediate-frequency amplifier chain for analog TV signals.

In a still further aspect of the invention, embodied in radio receivers of plural-conversion type that also embody the principal aspect of the invention, the intermediate-frequency amplifier chain for DTV signals and the intermediate1 frequency amplifier chain for analog TV signals contain respective mixers superheterodyning amplified first detector responses with oscillations from a shared second local oscillator.

BRIEF DESCRIPTION OF THE DRAWING

Each of FIGS. 1–5 is a block schematic diagram of radio receiver portions of a respective receiver for analog TV and digital TV signals, which radio receiver portions embody the invention.

DETAILED DESCRIPTION

Figure 1:
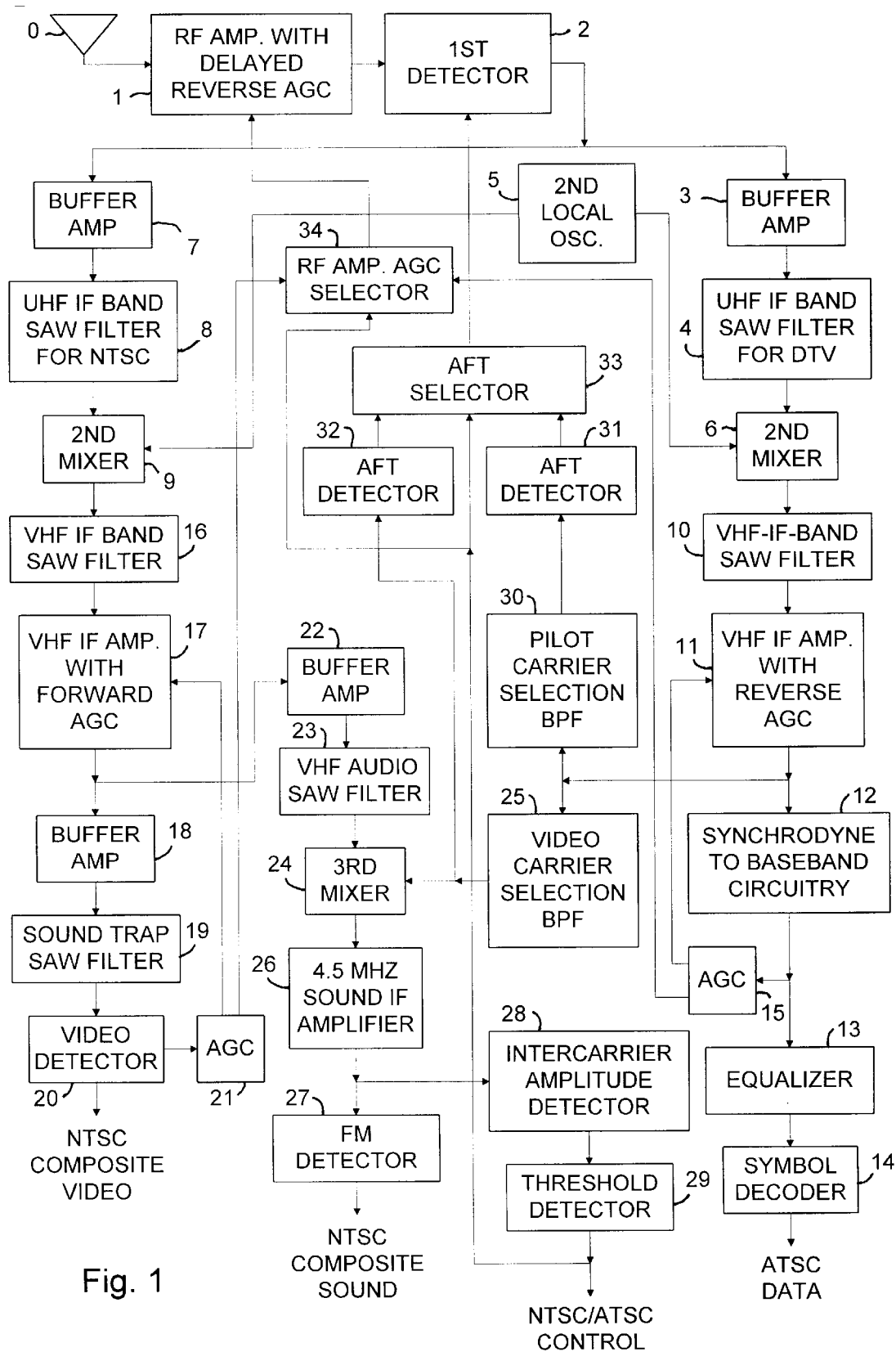

FIG. 1 shows the radio receiver portions of a television receiver capable of receiving either analog TV signals or digital TV signals. An antenna 0 is a representative source of television signals in the very high frequency (VHF) and ultra high frequency (UHF) bands for application to a radio-frequency (RF) amplifier 1. The RF amplifier 1 is provided with a tracking preselection filter for selecting a portion of the one of the television broadcast bands the television signal selected for reception reposes in. The RF amplifier 1 supplies amplified response to the television signal selected for reception to a first detector 2. The first detector 2 typically comprises a first local oscillator with automatic fine tuning, a frequency synthesizer for generating super-heterodyning signal of a frequency in selected ratio with the frequency of the first local oscillator, a first mixer for mixing the selected radio-frequency signal with the super-heterodyning signal to generate a UHF intermediate-frequency signal, and a front-end filter for suppressing the image of that IF signal in the output signal supplied from the first mixer. The first mixer is preferably of a doubly-balanced linear-multiplication type. The first detector 2 translates the 6-MHz-wide selected radio-frequency signal so as to be nominally centered at an ultra-high frequency above that portion of the UHF band containing assigned channels for television broadcasting, placing the image frequencies well above 1 GHz so they are easily rejected by a bandpass coupling network. That is, by way of example, the first detector 2 can be similar to prior-art first detectors in plural-conversion digital high-definition digital television (HDTV) receivers used by the Grand Alliance during field testing of terrestrial over-ihe-air IIDTV broadcasting in accordance with the ATSC standard, with the UHF IF signal being centered at 920 MHz.

The portion of the FIG. 1 radio receiver specifically for digital TV signals, at the right of the figure, can be similar to those described in U.S. Pat. No. 5,479,449. The UHF IF signal supplied from the first detector 2 is applied via a buffer amplifier 3 to a surface-acoustic-wave filter 4 having a substantially linear-phase, flat-amplitude response that has −1 dB to −1 dB bandwidth of 5.7–6.0 MHz. The buffer amplifier 3 provides fixed gain to make up the 10–12 dB insertion loss of the SAW filter 4 and drives the SAW filter 4 from a fixed source impedance chosen to avoid unwanted reflections. The response of the SAW filter 4 and UHF local oscillations from a second local oscillator 5 are applied as first and second input signals, respectively, to a second mixer 6 for downconverting the SAW filter 4 response to generate a first VHF intermediate-frequency signal.

The portion of the FIG. 1 radio receiver specifically for digital TV signals, at the left of the figure, includes a buffer amplifier 7 for applying UHF IF signal supplied from the first detector 2 to a surface-acoustic-wave filter 8 having a having substantially linear-phase response over a bandwidth in excess of 6 MHz, but exhibiting an amplitude roll-off at higher frequencies that is 6 dB down in gain at the frequency in the UHF IF signal that the video carrier is translated to by the first detector 2. This roll-off makes it easier to suppress beats between the video carrier and the sound carrier of the next lower adjacent TV channel. The buffer amplifier 7 provides fixed gain to make up the 10–12 dB insertion loss of the SAW filter 8 and drives the SAW filter 8 from a fixed source impedance chosen to avoid unwanted reflections. The buffer amplifiers 3 and 7 preclude any interactions between the SAW filters 4 and 8 arising from being driven directly from the first detector 2 as a common source. The response of the SAW filter 8 and local oscillations from the second local oscillator 5 are applied as first and second input signals, respectively, to a further second mixer 9 for down-converting the SAW filter 8 response to generate a second VHF intermediate-frequency signal.

The second mixers 6 and 9 are preferably each of a doubly-balanced linear-multiplication type. The second local oscillator 5 and the second mixer 6 provide a first downconverter for downconverting first amplified ultra-high-frequency intermediate-frequency signal from the first UHF IF amplifier, formed by the cascade connection of the buffer amplifier 3 and the SAW filter 4, to generate a very-high-frequency first downconverter response. The second local oscillator 5 and the second mixer 9 provide a second downconverter for downconverting second amplified ultra-high-frequency intermediate-frequency signal from the second UHF IF amplifier, formed by the cascade connection of the buffer amplifier 7 and the SAW filter 8, to generate a very-high-frequency second downconverter response.

In addition to the buffer amplifier 3, the SAW filter 4 and the second mixer 6 the IF amplifier chain for DTV signals includes a first VHF IF amplifier formed by a cascade connection of a surface-acoustic-wave filter 10 and a wide-band intermediate-frequency amplifier 11. The SAW filter 10 has a substantially linear-phase, flat-amplitude response over a bandwidth in excess of 6 MHz and supplies the amplifier 11 frequency selective response to the first VHF IF signal from the second mixer 6. The mixer 6 is designed so that its output impedance provides optimal source impedance to the SAW filter 10, in order to avoid unwanted reflections. The response of the SAW filter 10 is amplified by the amplifier 11, stages of which are provided reverse AGC. The resulting first amplified VHF IF signal from the IF amplifier 11 is synchrodyned to baseband by synchrodyning circuitry 12, and the resulting in-phase (or real) baseband signal is equalized by equalizer circuitry 13. The resulting equalized in-phase baseband signal is supplied to a symbol decoder 14. The symbol decoder 14 performs data-slicing operations on the equalized baseband signal to recover data supplied to a trellis decoder in portions of the HDTV receiver not shown in FIG. 1.

The in-phase baseband signal from the synchrodyning circuitry 12 is supplied to delayed automatic gain-control circuitry 15 that generates AGC signals for controlling the gains of stages in the IF amplifier 11 and that generates a delayed AGC signal for controlling the gain of the RF amplifier 1 during DTV signal reception. The AGC circuitry 15 can take any of a number of known forms. In the early Grand Alliance receivers the AGC circuitry for DTV signals used a matched filter responsive to data segment code groups, and of the response of this matched filter was peak detected to develop a basic AGC signal which was then use to develop delayed AGC for the IF amplifier stages. An AGC that responds to average symbol value can be used, as described by Citta el alii in U.S. Pat. No. 5,565,932 entitled "AGC SYSTEM WITH PILOT USING DIGITAL DATA REFERENCE". Allowed U.S. patent application Ser. No. 08/573,454 filed Dec. 15, 1995 by C. B. Patel and the inventor, now U.S. Pat. No. 5,636,252, issued on Jun. 3, 1997, entitled "AUTOMATIC GAIN CONTROL OF RADIO RECEIVER FOR RECEIVING DIGITAL HIGH-DEFINITION TELEVISION SIGNALS" describes AGC circuitry that detects the direct component of the baseband signal generated by synchrodyning the pilot carrier to baseband during the reception of DTV signals. The form for AGC circuitry 15 preferred by the inventor is a modification of the AGC circuitry described in U.S. patent application Ser. No. 08/573,454, which modification falls back on envelope detection of the IF amplifier 11 response to develop AGC during the reception of analog TV signals. This prevents the IF amplifier 11 from operating with excessive gain during the reception of analog TV signals, so that video carrier signals can be extracted from the IF amplifier 11 response.

U.S. Pat. No. 5,479,449 describes the synchrodyning circuitry 12 as including circuitry for converting the amplified second IF signal to a final IF signal somewhere in a 1 to 8 MHz band, an analog-to-digital converter for digitizing the final IF signal, and digital circuitry for completing the synchrodyne to baseband in the digital regime. Alternatively, as in the receivers used by the Grand Alliance during HDTV field testing, the synchrodyning circuitry 12 can be operative in the analog regime, with the analog baseband signal being digitized by an analog-to-digital converter for application to the equalizer circuitry 13. The equalizer circuitry 13 is then cascaded with a phase tracker operative at baseband.

In addition to the buffer amplifier 7, the SAW filter 8 and the second mixer 9 the IF amplifier chain for analog TV signals includes a second VHF IF amplifier formed by a cascade connection of a surface-acoustic-wave filter 16 and a wideband intermediate-frequency amplifier 17. The SAW filter 16 has a substantially linear-phase, flat-amplitude response over a bandwidth in excess of 6 MHz and supplies the amplifier 17 frequency selective response to the first VHF IF signal from the second mixer 9. The SAW filter 16 can be of the same design as the SAW filter 10, presuming the second mixers 6 and 9 use same-frequency second local oscillations. The mixer 9 is designed so that its output impedance provides optimal source impedance to the SAW filter 16, in order to avoid unwanted reflections. The response of the SAW filter 16 is amplified by the amplifier 17, with an earlier one of its stages provided forward ACC. At least one of its later stages must also be provided with AGC in order to provide the AGC range required of a commercial television receiver. The AGC of a later stage of the amplifier 17 can be forward AGC or reverse AGC per standard practices in analog TV receiver design.

The second amplified VHF intermediate-frequency signal from the IF amplifier 17 is supplied via a buffer amplifier 18 to a surface-acoustic-wave filter 19 that traps the FM sound carrier to prevent 920 kHz beats with chroma subcarrier in the composite video signal detected by a video detector 20 supplied the SAW filter 19 response. The buffer amplifier 18 provides fixed gain to make up the 15–17 dB insertion loss of the SAW filter 19 and drives the SAW filter 19 from a fixed source impedance chosen to avoid unwanted reflections.

The composite video signal detected by the video detector 20 is supplied to automatic gain-control circuitry 21 that generates AGC signals for controlling the gains of stages in the IF amplifier 17 and a delayed AGC signal for controlling the gain of the RF amplifier 1 during analog TV signal reception. The video detector 20 can be either a synchronous detector or an envelope detector. Or, the video detector can comprise a synchronous detector for supplying composite video signal to the luminance and chrominance separation circuitry of the receiver and can further comprise an envelope detector for supplying composite video signal to the AGC circuitry 21 and the sync separation circuitry of the receiver. Usually, a synchronous detector detects with a higher degree of linearity than an envelope detector and better suppresses Johnson noise, justifying the higher cost of synchronous detection as long as an appreciable portion of TV broadcasting is done in accordance with NTSC standards. The AGC circuitry 21 follows a conventional design for an analog TV receiver, which designs typically detect the amplitude of the tips of horizontal synchronizing pulses to generate an AGC signal.

The amplified third intermediate-frequency signal from the IF amplifier 17 is supplied via a buffer amplifier 22 to a surface-acoustic-wave filter 23. The buffer amplifier 22 drives the SAW filter 21 from a fixed source impedance chosen to avoid unwanted reflections. The buffer amplifiers 18 and 22 preclude any interactions between the SAW filters 19 and 23 arising from being driven directly from the IF amplifier 17 as a common source. When an NTSC analog TV signal is received, the SAW filter 21 selects the FM sound carrier of that signal (as translated to VHF intermediate frequencies) for application to a third mixer 24 as first input signal thereto. The mixer 24 receives, as its second input signal, response from a narrowband bandpass filter 25. The filter 25 supplies video carrier (as translated to VHF intermediate frequency) in response to the first amplified VHF IF signal output from the VHF IF amplifier 11. When NTSC analog TV signals are being received, the output signal from the mixer 24 is a frequency-modulated 4.5 MHz intercarrier; and, when NTSC analog TV signals are not being received, the output signal from the mixer 24 is noise. The output signal from the mixer 24 is amplified in a high-gain sound IF amplifier 26 designed to limit only when frequency-modulated 4.5 MHz intercarrier is present in that signal. The response of the sound IF amplifier 26 is supplied to a frequency discriminator or frequency-modulation detector 27, which reproduces NTSC composite sound signal. This NTSC composite sound signal is a baseband signal comprising a main channel component that is a left-plus-right signal during stereophonic sound transmissions. During stereophonic sound transmissions the NTSC composite Sound signal comprises a stereophonic subcarrier amplitude modulated by a left-minus-right signal. The NTSC composite sound signal may also comprise other subcarriers modulated by subsidiary audio program (SAP) signal(s).

One skilled in the art of analog TV receiver design will understand that the SAW filter 19 can be replaced with other types of sound trap filtering, such as the bridged-T by way of example, which other types of sound trap filtering are considered to be equivalents of the SAW filter 19 insofar as the invention is concerned. One skilled in the art of analog TV receiver design will also understand that the SAW filter 23 can be replaced with other types of sound IF selection filtering. such as a double-tuned transformer by way of example, which other types of sound IF selection filtering are considered to be equivalents of the SAW filter 23 insofar as the invention is concerned.

The fact that frequency-modulated 4.5 MHz intercarrier signal is present in output signal from the mixer 24 only when NTSC analog TV signals are being received either intentionally or because of strong co-channel interference during DTV signal reception is exploited in the FIG. 1 circuitry to develop a NTSC/ATSC CONTROL signal. Amplified mixer 24 output signal is supplied from the sound IF amplifier 26 to an intercarrier amplitude detector 28, which detects the average amplitude of the 4.5 MHz intercarrier. The intercarrier amplitude detector 28 can be a simple envelope detector with a time constant of several NTSC scan lines, for example. The baseband response of the amplitude detector 28 is supplied to a threshold detector 29, which generates the NTSC/ATSC CONTROL signal as its output signal. The threshold detector 29 provides an indication of probable NTSC signal reception, if the detected intercarrier signal exceeds a threshold value in amplitude, and otherwise provides an indication of probable DTV signal reception free from appreciable co-channel interference.

When a DTV signal is being received, the baseband symbol coding recovered by the synchrodyne circuitry 12 will be accompanied by a direct component resulting from synchronous detection of the pilot carrier. This direct component can be sensed to confirm DTV signal reception. If DTV signal reception is thus confirmed, but the threshold detector 29 provides an indication of probable NTSC signal reception, DTV signal reception with appreciable co-channel interference is indicated.

It is preferable, the inventor points out, that the SAW filter 4 have a substantially linear-phase, flat-amplitude response that suppresses the frequency-modulated NTSC sound carrier and that accordingly has a −1 dB to −1 dB bandwidth of only 5.7 MHz. This permits use of a preferred form for the symbol decoder 14, which preferred form selectively employs a comb filter additively combining symbols six epochs apart for suppressing NTSC co-channel interference. This form of the symbol decoder 14 is described in U.S. patent application Ser. No. 08/746,520 filed on Nov. 12, 1996, now U.S. Pat. No. 5,748,226, issued May 5, 1998, entitled "DIGITAL TELEVISION RECEIVER WITH ADAPTIVE FILTER CIRCUITRY FOR SUPPRESSING NTSC CO-CHANNEL INTERFERENCE", and incorporated herein by reference. With the skirts of the SAW filter 4 response being so critically located within the frequency spectrum, automatic fine tuning (AFT) of the first local oscillator in the first detector 2 becomes practically a necessity. The second local oscillator 5 is crystal stabilized, so that the first amplified VHF IF signal from the VHF IF amplifier 11 can be used for AFT during the reception of DTV signals. The fact that the responses of the SAW filters 4 and 10 are both amplitude-flat and phase-linear to the edge of the band at which the pilot carrier of the DTV signal and the video carrier of an NTSC analog TV signal are located makes the first amplified VHF IF signal a suitable signal source for the generation of AFT signals no matter whether the TV signal being currently received is a DTV signal or an analog TV signal.

When a DTV signal is received, a narrow bandpass filter 30 selects to an AFT detector 31 pilot carrier, as translated to a VHF intermediate frequency in the first amplified VHF IF signal from the VHF IF amplifier 11. The AFT detector 31 is similar in its general construction to those previously used in analog TV signal receivers, typically comprising a limiter amplifier for the bandpass filter response it receives as input signal, a phase shifter for shifting the pilot carrier 90° when it is at prescribed VHF intermediate frequency, a multiplier for multiplying the differentially phase-shifted pilot carrier signals together, and a lowpass filter for extracting the AFT signal from the resulting product.

When an analog TV signal is received, the narrow bandpass filter 25 selects to an AFT detector 32 video carrier, as translated to a VHF intermediate frequency in the first amplified VHF IF signal from the VHF IF amplifier 11. The AFT detector 32 is similar in its general construction to those previously used in analog TV signal receivers, typically comprising a limiter amplifier for the bandpass filter response it receives as input signal, a phase shifter for shifting the pilot carrier 90° when it is at prescribed VI IF intermediate frequency, a multiplier for multiplying the differentially phase-shifted pilot carrier signals together, and a lowpass filter for extracting the AFT signal from the resulting product.

An AFT selector 33 selects the AFT signal from the AFT detector 32 for application to the first local oscillator in the first detector 2 when the NTSC/ATSC control signal supplied from the threshold detector 28 indicates that an analog TV signal of substantial strength is being received. The AFT selector 33 selects the AFT signal from the AFT detector 31 for application to the first local oscillator in the first detector 2 when the NTSC/ATSC control signal does not indicate that an analog TV signal of substantial strength is being received.

An AGC selector 34 selects a delayed AGC signal from the AGC detector 21 for application to the radio-frequency amplifier 1 when the NTSC/ATSC control signal supplied from the threshold detector 28 indicates that an analog TV signal of substantial strength is being received. The AGC selector 34 selects a delayed AGC signal from the AGC detector 15 for application to the RF amplifier 1 when the NTSC/ATSC control signal does not indicate that an analog TV signal of substantial strength is being received. Alternatively, the gain of the RF amplifier 1 can be reduced by the larger of delayed AGC signals respectively supplied by the AGC detectors 15 and 21, as determined by an analog OR circuit, rather than using the AGC selector 34 responsive to the NTSC/ATSC control signal supplied from the threshold detector 28. Since the gain of the radio-frequency amplifier 1 is reduced only for larger RF signals, gain reduction method that is accompanied by some loss of noise figure can be tolerated without analog TV reception becoming too noticeably noisy. Accordingly, the RF amplifier is preferably provided with reverse AGC better to maintain linearity of gain for DTV reception.

Figure 2:
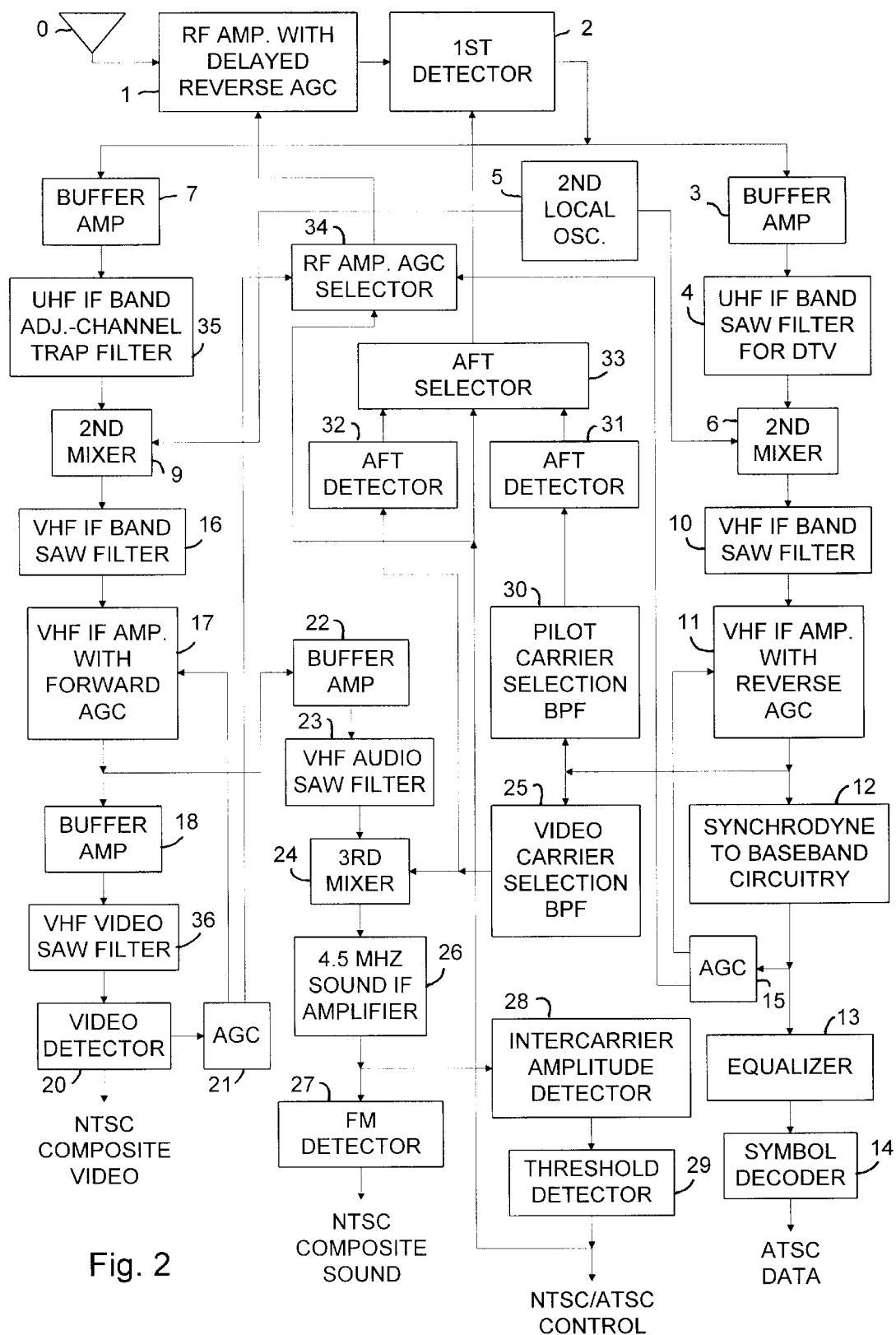

FIG. 2 shows portions of a radio receiver for receiving analog TV and digital TV signals, which radio receiver portions differ from those in FIG. 1 in the following regards. The SAW filter 8 with −6 dB roll-off in gain for video carrier (as translated to UHF intermediate frequency) is replaced by adjacent-channel trap filtering 35, as can be provided by a SAW filter or can be constructed using inductors and capacitors. The video SAW filter 18 with sound carrier rejection, but with flat-amplitude response at the other end of the VHF IF band is replaced by a video SAW filter 36 providing −6 dB roll-off in overall IF gain at video carrier as translated to VI IF intermediate frequency as well as rejection of FM sound carrier as translated to VHF intermediate frequency. An example of a SAW filter exhibiting this type of response for video carrier translated to 45.75 MHz and sound carrier translated to 41.25 MHz is the SAF45 MVB80Z manufactured by Murata Manufacturing Co., Ltd., in Erie, Pa.

Figure 3:
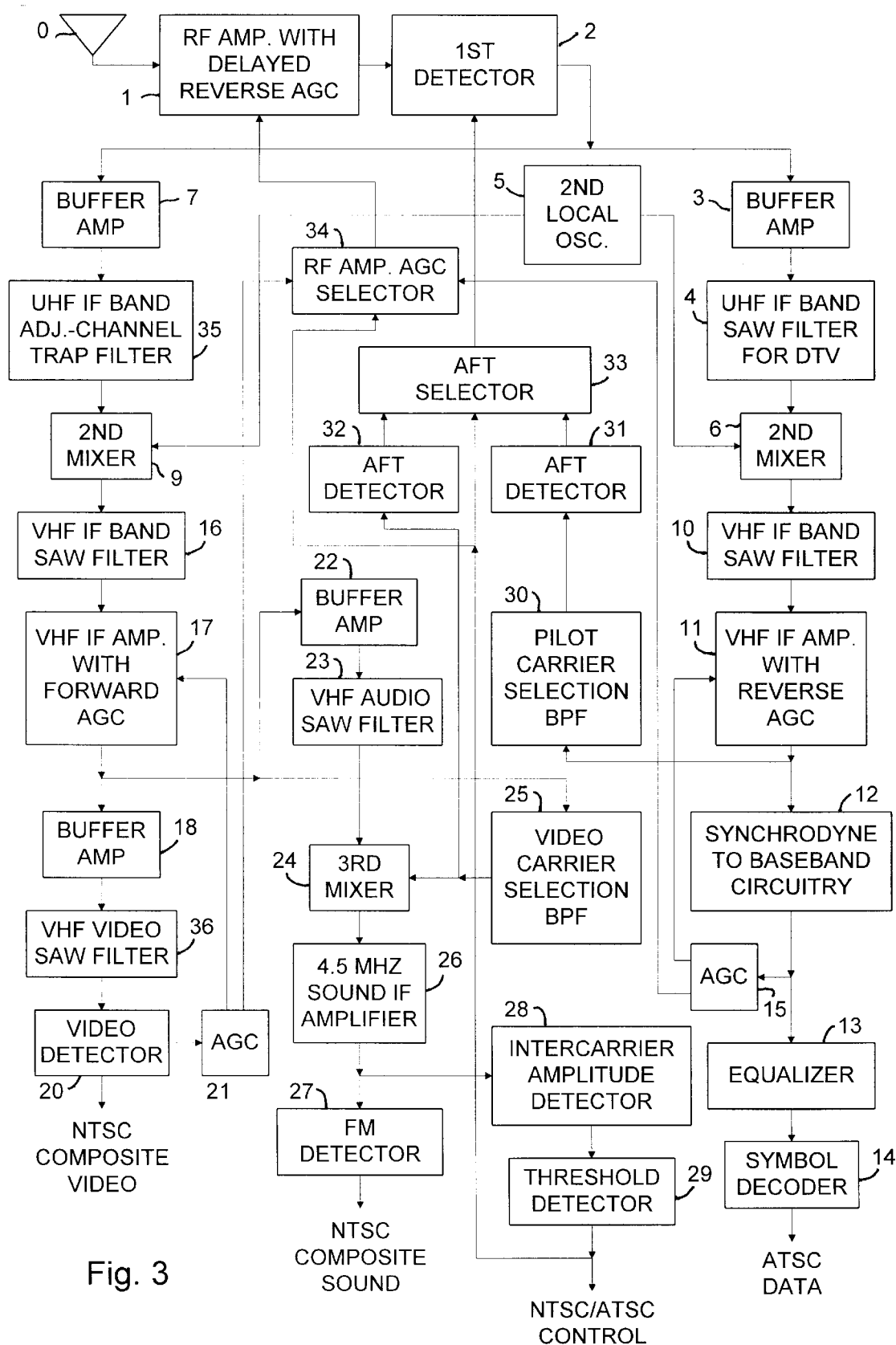

FIG. 3 shows a modification of the FIG. 2 radio receiver portions in which the second amplified VHF IF signal supplied by the VHF IF amplifier 17 is supplied as input signal to the bandpass filter 25 used for video carrier selection, rather than the bandpass filter 25 receiving as its input signal the first amplified VHF IF signal supplied by the VHF IF amplifier 11. Since the adjacent-channel trap filtering 35 exhibits no roll-off in gain for video carrier (as translated to VHF intermediate frequency), there is accordingly no roll-off in gain for video carrier (as translated to VHF intermediate frequency) in the second amplified VHF IF signal supplied by the VHF IF amplifier 17. This suits it for use in developing AFIT signal during analog TV reception. The type of AGC applied to the VHF IF amplifier 17 makes the second amplified VHF IF signal it supplies somewhat better for AFT purposes than the first amplified VHF IF signal supplied from the VHF IF amplifier 11.

Figure 4:
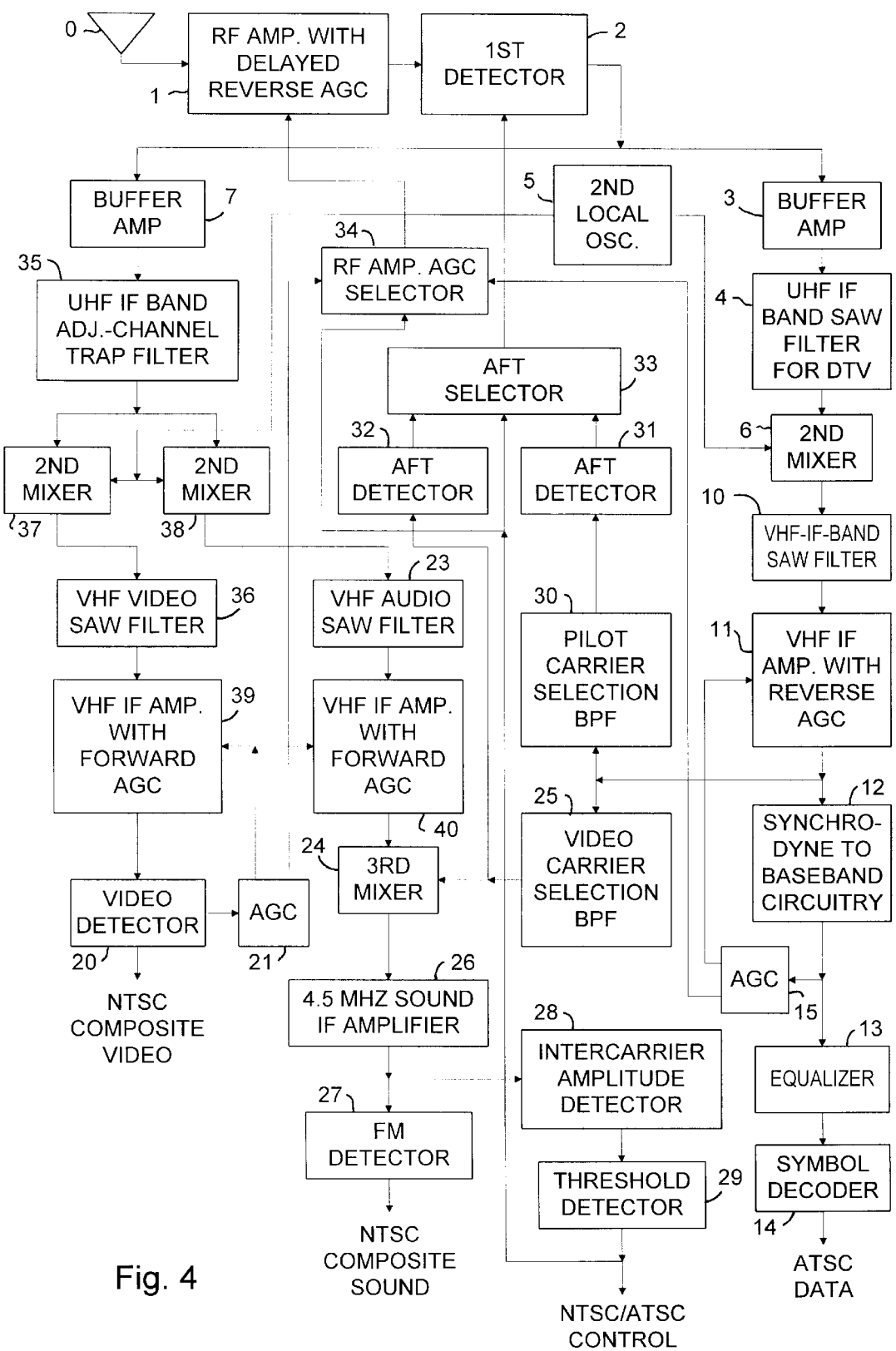

FIG. 4 shows modifications of the FIG. 2 radio receiver portions of a TV receiver, which modifications provide partially parallel IF amplifier chains for the NTSC video carrier modulation and for the NTSC audio carrier modulation. The second mixer 9 is replaced by two second mixers 37 and 38; and the VHF IF amplifier 17 and the buffer amplifiers 18 and 22 are replaced by two VHF IF amplifiers 39 and 40 similar in their respective construction. The second mixers 37 and 38 are preferably each of a doubly-balanced linear-multiplication type and are designed to drive the SAW filters 36 and 23 from source impedances that minimize multiple reflections. The second local oscillator 5 and the second mixer 37 provide a second downconverter for downconverting second amplified ultra-high-frequency intermediate-frequency signal from the second UHF IF amplifier, formed by the cascade connection of the buffer amplifier 7 and the adjacent-channel trap filtering 35, to generate a VHF second downconverter response supplied to the SAW filter 36 as its input signal. The second local oscillator 5 and the second mixer 38 provide a third downconverter for downconverting second amplified ultra-high-frequency intermediate-frequency signal from the second UHF IF amplifier, to generate a V HF third downconverter response supplied to the SAW filter 23 as its input signal. The VHF IF amplifier 39 amplifies the response of the SAW filter 36 to NTSC video carrier modulation for application to the video detector 20, and the VHF IF amplifier 40 amplifies the response of the SAW filter 23 to NTSC audio carrier modulation for application to the third mixer 24. The VHF IF amplifiers 39 and 40 are subjected to corresponding automatic gain control signal from the AGC circuitry 21 so that their respective gains track each other.

Figure 5:
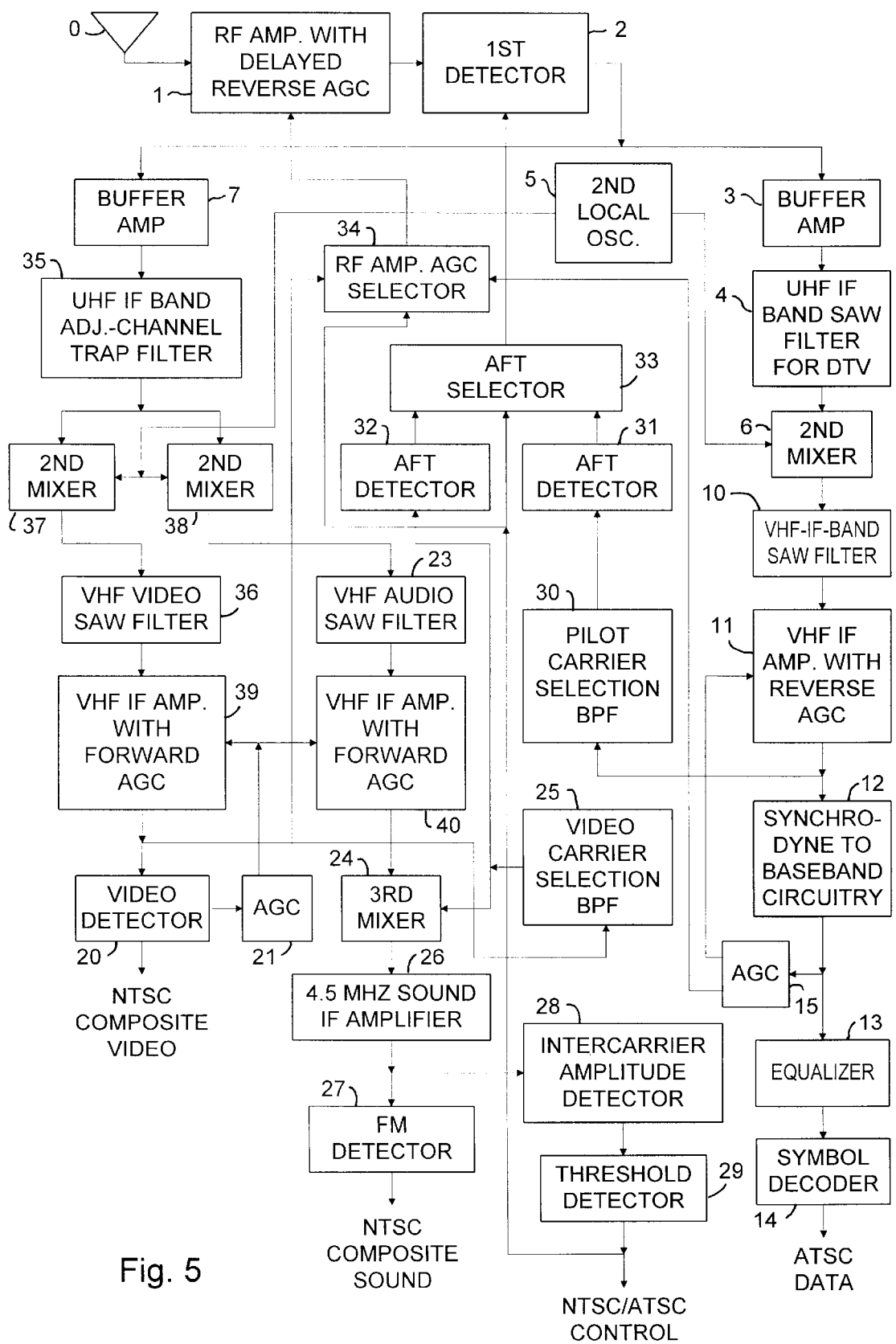

FIG. 5 shows a modification of the FIG. 4 radio receiver portions of a TV receiver, in which modification the second amplified VHF IF signal supplied by the VHF IF amplifier 17 is supplied as input signal to the bandpass filter 25 used for video carrier selection, rather than the bandpass filter 25 receiving as its input signal the first amplified VHF IF signal supplied by the VHF IF amplifier 11. Since the adjacent-channel trap filtering 35 exhibits no roll-off in gain for video carrier (as translated to UHF intermediate frequency), there is accordingly no roll-off in gain for video carrier (as translated to VHF intermediate frequency) in the second amplified VHF IF signal supplied by the VHF IF amplifier 17. This suits it for use in developing AFT signal during analog TV reception. The type of AGC applied to the VHF IF amplifier 17 makes the second amplified VHF IF signal it supplies somewhat better for AFT purposes than the first amplified VHF IF signal supplied from the VHF IF amplifier 11.

Figure 6:
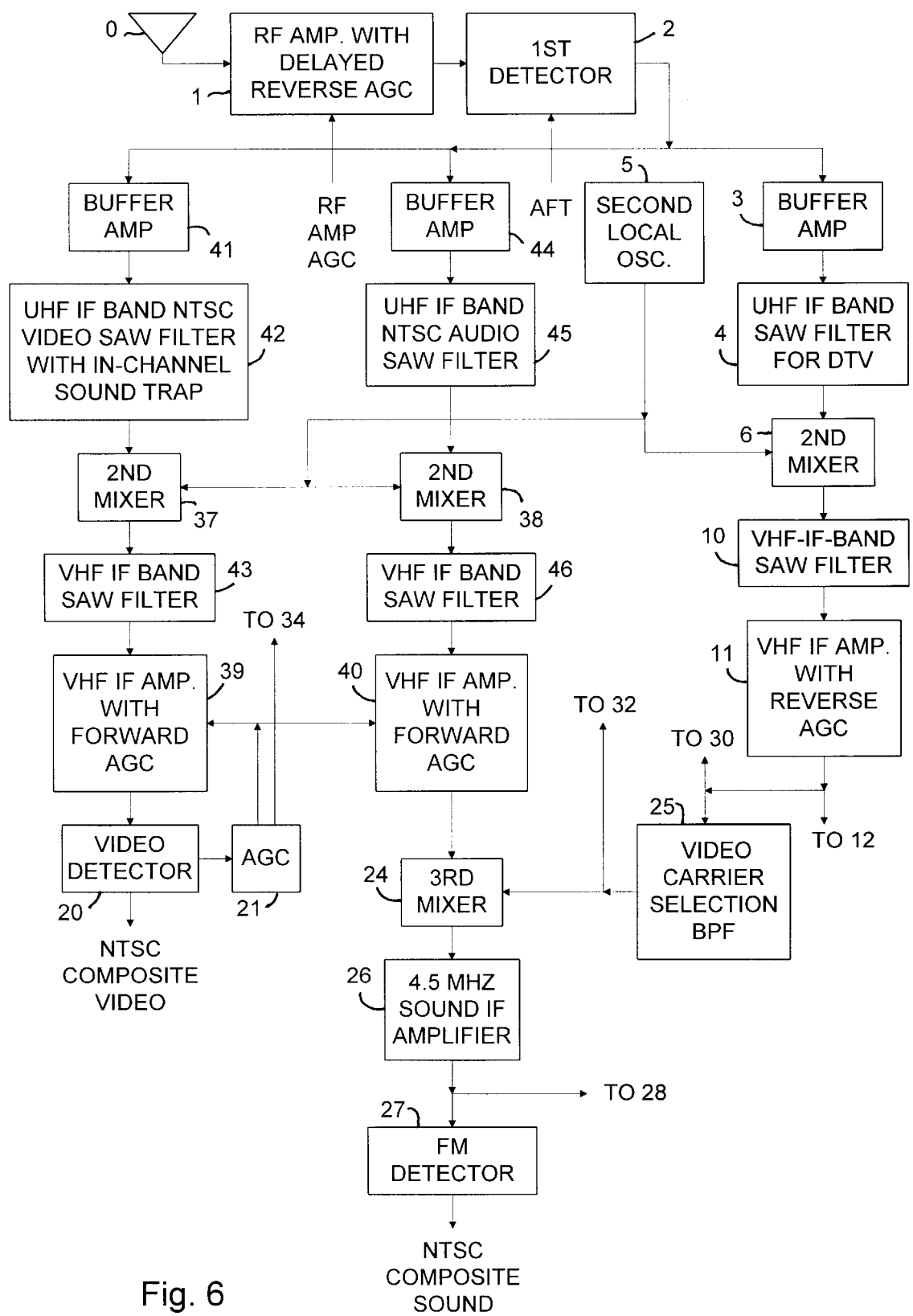
FIG. 6 is a block schematic diagram of modifications made of the FIG. 4 radio receiver portions in another embodiment of the invention in which there are parallel IF amplifiers for the video and audio portions of NTSC analog TV signal.

FIG. 6 shows modifications of the FIG. 4 radio receiver portions of a TV receiver, which modifications provide completely parallel IF amplifier chains for the NTSC video carrier modulation and for the NTSC audio carrier modulation. The buffer amplifier 7 and the adjacent-channel trap filtering 35 are dispensed with. Instead, the second mixer 37 receives its first input signal from the cascade connection of a buffer amplifier 41 and a surface-acoustic-wave filter 42, and the second mixer 38 receives its first input signal from the cascade connection of a buffer amplifier 43 and a surface-acoustic-wave filter 44. The SAW filter 36 in the VHF IF band is dispensed with and replaced by SAW filter 45, which has flat-amplitude and linear-phase response over a bandwidth of at least 6 MHz, so as not to affect the overall IF bandwidth appreciably.

The overall IF bandwidth for NTSC video modulation is defined by the SAW filter 42, which replaces the adjacent-channel trap filtering 35 and introduces the −6 dB roll-off of video carrier needed for equalizing video response from the video detector 20. The UHF IF signal supplied from the first detector 2 is applied to the SAW filter 42 via the buffer amplifier 41 which provides fixed gain to make up the 10–12 dB insertion loss of the SAW filter 42 and drives the SAW filter 42 from a fixed source impedance chosen to avoid unwanted reflections. The SAW filter 42 differs from the SAW filter 8 of FIG. 1 in having an in-channel sound trap as well as an adjacent-channel sound trap. The SAW filter 42 has a substantially linear-phase response over a bandwidth of 5.5 MHz, exhibiting an amplitude roll-off at frequencies near the video carrier to provide a response that is 6 dB down in gain at the frequency in the UHF IF signal that the video carrier is translated to by the first detector 2.

Insofar as the NTSC audio carrier modulation is concerned, the SAW filter 44 separates the frequencies in the UHF IF band as may contain FM sound carrier, for application to the second mixer 38. The UHF IF signal supplied from the first detector 2 is applied to the SAW filter 44 via the buffer amplifier 43. The buffer amplifier 43 provides fixed gain to make up the insertion loss of the SAW filter 44 and drives the SAW filter 44 from a fixed source impedance chosen to avoid unwanted reflections.

Figure 7:
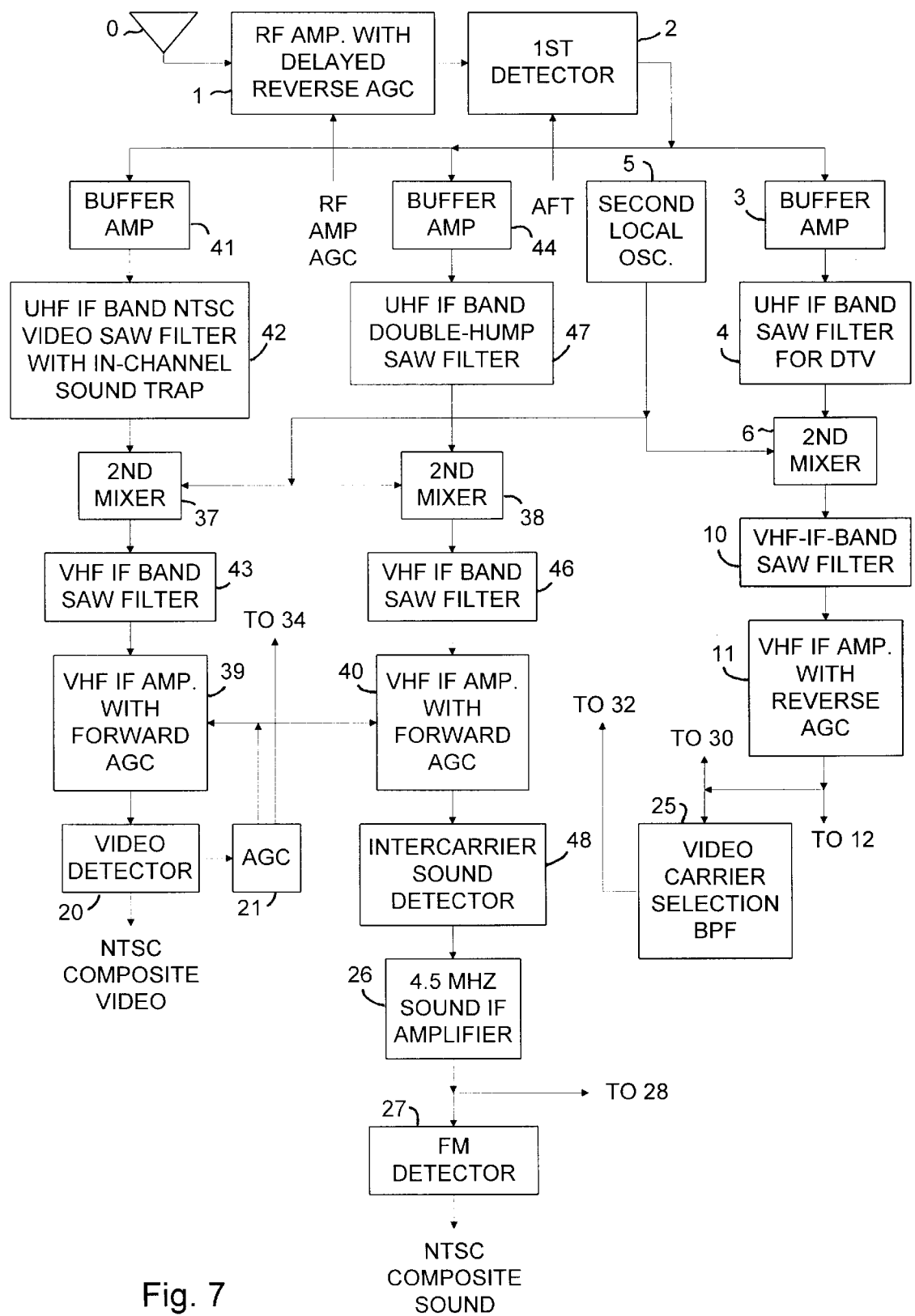
FIG. 7 is a block schematic diagram of modifications of the FIG. 4 radio receiver portions in an embodiment of the invention in which the video carrier and FM sound carrier components of the NTSC analog TV signal are amplified by UHF and VHF intermediate-frequency amplifiers in a "quasi-parallel" arrangement.

FIG. 7 shows modifications of the FIG. 6 radio receiver portions of a TV receiver, in which modifications the sound component of the NTSC analog TV signal is amplified by IF amplifiers in the so-called "quasi-parallel" arrangement. The SAW filter 44 for FM sound carrier components in the UHF IF band is replaced by a surface-acoustic-wave filter 46 having a double-hump response peaking at the NTSC audio carrier and at the NTSC video carrier, as translated to the UHF IF band, and at least 10 dB down in response between humps. The UHF IF signal supplied from the first detector 2 is applied to the SAW filter 46 via the buffer amplifier 44 which provides fixed gain to make up the 10–12 dB insertion loss of the SAW filter 46 and drives the SAW filter 46 from a fixed source impedance chosen to avoid unwanted reflections. The SAW filter 23 following the second mixer 38, which passes only FM audio carrier as translated to VHF intermediate frequencies, is replaced by a SAW filter 47, which has bandwidth sufficient to pass the response of the SAW filter 46 as downconverted to VHF intermediate frequencies by the second mixer 38. The third mixer 24 is replaced by a non-linear device operative as an intercarrier sound detector 41, such as the rectifier in a simple envelope detector, which device generates intercarrier input signal for the 4.5 MHz sound IF amplifier 24.

Figure 8:
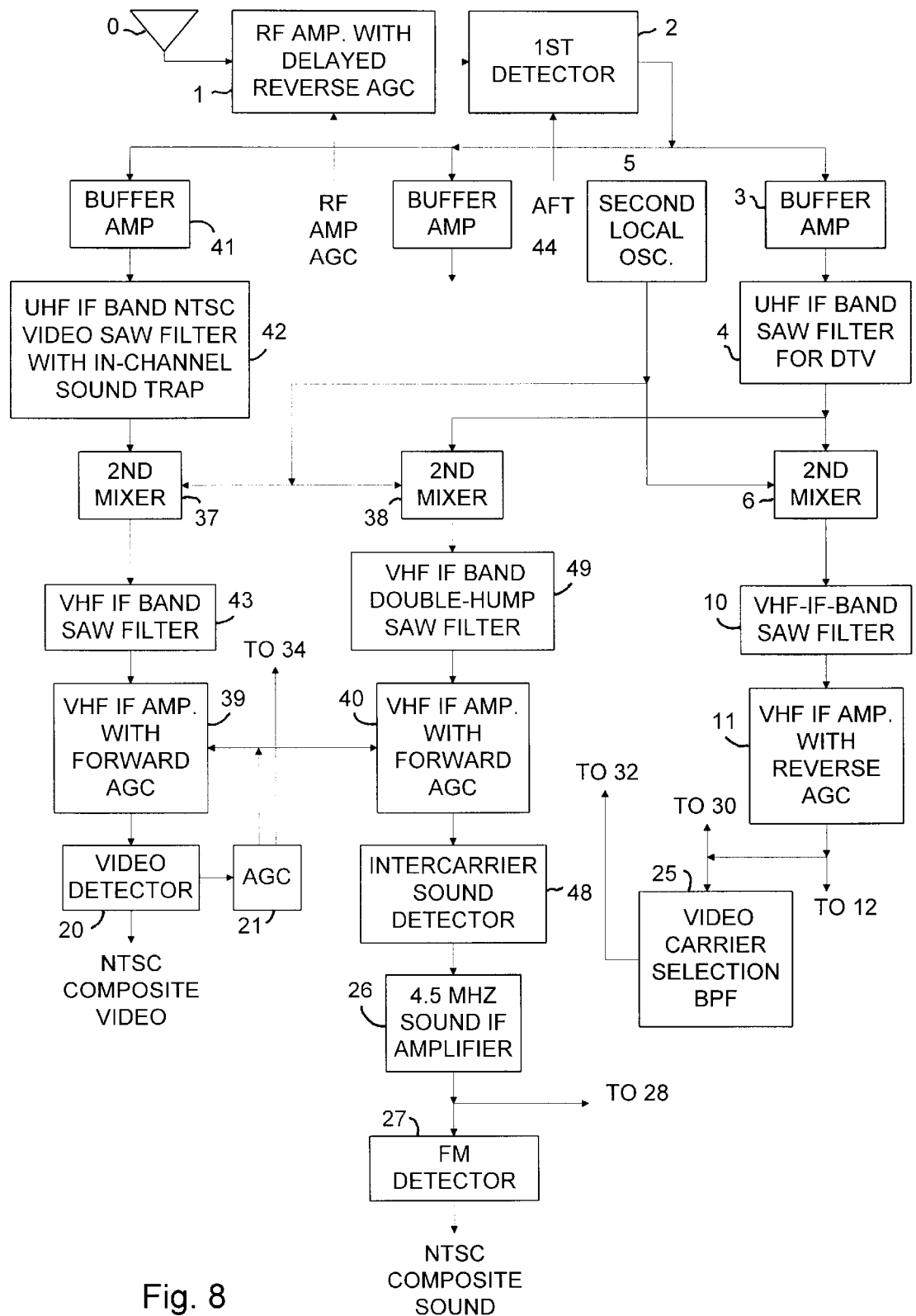
FIG. 8 is a block schematic diagram of alternative modifications of the FIG. 4 radio receiver portions in another embodiment of the invention in which the video carrier and FM sound carrier components of the NTSC analog TV signal are extracted from the amplified DTV UHF IF signal after downconversion and are amplified by just a VHF intermediate-frequency amplifier in a "quasi-parallel" arrangement.

FIG. 8 shows modifications of the FIG. 7 radio receiver portions of a TV receiver, in which modifications the buffer amplifier 43 and SAW filter 44 with double-hump response in the UHF IF, band are dispensed with, the second mixer 38 is supplied with first amplified UHF IF signal from the UHF IF amplifier 4 instead, and the SAW filter 47 is replaced by a surface-acoustic-wave filter 49 having double-hump response in the VHF IF band. That is, the filter 46 has a double-hump response peaking at the NTSC audio carrier and at the NTSC video carrier, as translated to the UHF IF band, and at least 10 dB down in response between humps.

There is no need to extract video carrier from the IF amplifier 11 response during the reception of analog TV signals when the modifications of FIG. 7 or of FIG. 8 are used, so there is no longer a particular necessity to keep the IF amplifier 11 from operating with excessive gain when DTV signals are not being currently received. This permits the AGC circuitry 15 to be simplified, since there is no longer a need to fall back on envelope detection of the IF amplifier 11 response to develop AGC when DTV signals are not being currently received.

In the radio receiver portions specifically described with reference to FIGS. 1–8, the IF amplifiers for the UHF IF band have fixed gain, rather than controlled gain; and the fixed gain is primarily used for overcoming insertion losses in SAW filters following the amplifiers. In addition to the advantages of a plural-conversion receiver in regard to overcoming image rejection problems, the UHF IF band is exploited in that the SAW filters with the large numbers of poles and zeroes that are needed for the desired overall IF response with flat passband and steep skirt rejection are more easily achieved in the UHF IF band than in the VHF IF band. The generation of up to 60–90 dB gain by wideband amplification and the control of that gain are more easily achieved in the VHF IF band than in the UHF IF band, since wideband amplification can be achieved at lower conductances while overcoming stray capacitance effects. In less preferred embodiments of the invention, controlled amplification may be employed in the UHF IF band as well as the VHF IF band, with a UHF IF amplifier for amplifying NTSC signals better being of the type using forward AGC for achieving low noise figure, and with a UHF IF amplifier for amplifying DTV signals better being of the type using reverse AGC for achieving linearity of gain.

In the radio receiver portions specifically described with reference to FIGS. 1–8, the first detector 2 can generate the UHF IF band as the difference of the frequency spectrum of the TV signal selected for reception subtracted from the frequency of the first local oscillations, resulting in the TV signal as translated to the UHF IF band exhibiting a reversed frequency spectrum respective to that of the TV signal as broadcast. Doing this, rather than generating the UHF IF band as the sum of the frequency spectrum of the TV signal selected for reception added to the frequency of the first local oscillations, advantageously keeps from having to tune the adjustable first local oscillator over much more than a 2:1 range in frequency. Accordingly, using second local oscillations above the UHF IF band results in the TV signal as translated to VHF IF band exhibiting a frequency spectrum that is not reversed from the transmitted spectrum, while using second local oscillations below the UHF IF band results in the TV signal as translated to VHF IF band exhibiting a frequency spectrum that is reversed from the transmitted spectrum. If the synchrodyne to baseband circuitry 12 is of the type in which the first amplified VHF IF signal from the VHF IF amplifier 11 is downconverted to a still lower IF band for digitization before completing the synchrodyne to baseband in the digital regime, there may be a desire to have the VHF IF signal in a prescribed spectrum order to facilitate digital processing. Using third local oscillations above the VHF IF band results in the TV signal as translated to still lower IF band exhibiting a frequency spectrum that is not reversed from the spectrum of the TV signal as translated to VHF IF band, while using third local oscillations below the VHF IF band results in the TV signal as translated to still lower band exhibiting a frequency spectrum that is reversed from the spectrum of the TV signal as translated to VHF IF band.

In the radio receiver portions specifically described with reference to FIGS. 1–8, the first local oscillator included in the first detector 2 can be one tuning from about 965 MHz to about 1815 MHz, so the first detector 2 generates UHF IF signal in a band extending from 917 to 923 MHz, and the second local oscillator can be one supplying 876 MHz oscillations to the second mixers 6 and 9 or to the second mixers 6, 37 and 38. This UHF IF band and frequency of second oscillations was used in the prior art to position the NTSC signal as translated to VHF intermediate frequencies in a 41–47 MHz VHF IF band, as conventionally occurs in single-conversion analog TV receivers, with the video carrier being translated to 45.75 MHz and with the audio carrier being translated to 41.25 MHz.

In a single-conversion analog TV receiver, the VHF IF band is placed far enough below the lowest VHF TV broadcast channel to prevent the second harmonic of the NTSC FM audio carrier falling into the 88–108 MHz FM broadcasting band, but otherwise as high in frequency as possible. The VHF IF band is kept as high as possible in order to prevent image frequencies from the single conversion falling too closeby the desired signal to be selected against by tuned radio-frequency amplification and to reduce slightly the number of octaves the first local oscillator must be tuned over. In a plural conversion TV receiver these are not significant problems. So the "VHF" IF band can be chosen lower in frequency, although is better kept above 30 MHz, rather than being allowed to repose in upper portions of the high-frequency (HF) band where the third harmonic of the NTSC FM audio carrier falling into the 88–108 MHz FM broadcasting band.

If the synchrodyne to baseband circuitry 12 is of the type in which reversed-spectrum first amplified VHF IF signal from the VHF IF amplifier 11 is downconverted to a still lower IF band for digitization, and if a DTV signal so down converted is to have a frequency spectrum not reversed from the frequency spectrum of the DTV signal as transmitted, the third local oscillations used for this further down conversion must be at a frequency above the VHF IF band. Placing the third local oscillations above 47 MHz risks interference with a nearby FM broadcast transmitter, so it is better to raise the frequency of the second local oscillations to be closer to the UHF IF band and to lower the frequency range of the VHF IF band so the third local oscillations can be below 44 MHz. This permits the frequency of second oscillations to be increased to fall just above the 890 MHz upper limit frequency of channel 83, and the UHF IF band to adjusted upward within acceptable range. If the frequency of second local oscillations chosen to be at 890.5 MHz and the UHF IF band is placed at 925.5–931.5 MHz, the third local oscillations can be kept just below 44 MHz. If the carrier of the DTV signal is translated to a final IF band still lower than the VHF IF band is to be near the lower limit frequency of that final IF band, it is better to use second local oscillations of a frequency below the UHF IF band, so the frequency spectrum in the VHF IF band is reversed from the frequency spectrum of the DTV signal as transmitted to the DTV receiver.

If in a triple-conversion DTV receiver the carrier of the DTV signal as translated to a final IF band still lower than the VHF IF band is to be near the upper limit frequency of that final IF band, the third local oscillations must be closer in frequency to the midband frequency of the VHF IF band than the VSB carrier as translated to VHF IF band. If the VSB carrier is just above the lower limit frequency of the VHF IF band, owing to the first local oscillations being above the UHF IF band, in order for the carrier of the VSB DTV signal to be above the midband frequency in the final IF band, the third local oscillations must be above the VHF IF band. It is preferable that the third oscillations are lower in frequency than 44 MHz, to prevent their second harmonic falling in the FM broadcast band. Also, the NTSC sound carrier is at the top of the VHF IF band, and it is desirable to prevent its second harmonic falling in the FM broadcast band. If there is no spectrum reversal owing to the second local oscillations being above the UHF IF band and if further the third local oscillations must be above the VHF IF band to place the carrier of the VSB DTV signal above the midband frequency in the third IF band, the VHF IF band must be located lower in frequency than 41–47 MHz. If the VHF IF band is located lower than 36–42 MHz, third harmonics of signals in this band overlap the top portion of the FM broadcast band. Within these constraints, the VSB carrier in the final IF band cannot be higher than 7.69 MHz.

If the VSB carrier is just below the upper limit frequency of the VHF IF band owing to the second local oscillations being below the UHF IF band, in order for the carrier of the VSB DTV signal to be above the midband frequency in the third IF band, the third local oscillations must be below the VHF IF band. If the VSB carrier is just below 47 MHz in a 41–47 MHz VHF IF band, third local oscillations below the VHF IF band, but above 36 MHz, have their harmonics outside the FM broadcast band. Within these constraints, the VSB carrier in the third IF band can be as high as 10.69 MHz. Locating the UHF IF band slightly higher in frequency allows a VSB carrier of 10.76 MHz. A 41–47 MHz VHF IF band is possible without the second local oscillations falling in the UHF TV broadcast band. If the frequency of second local oscillations chosen to be at 890.5 MHz, the UHF IF band must be at 931.5–937.5 MHz.

Figure 9:
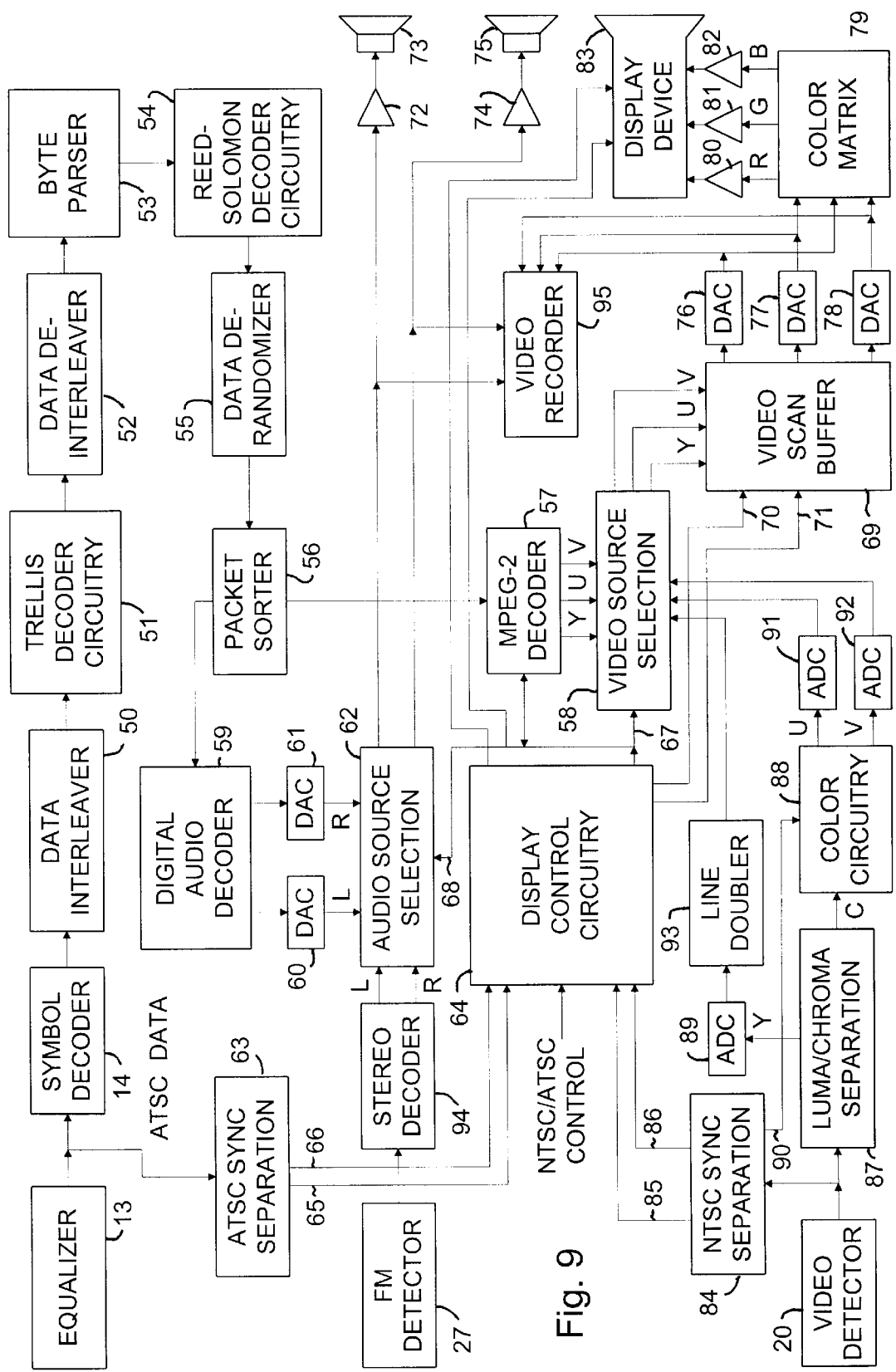
FIG. 9 is a block schematic diagram of the remaining portions of the TV receiver of any of FIGS. 1–5 and of the TV receiver of FIG. 4 as modified per any of FIGS. 6, 7 or 8.

FIG. 9 shows the remaining portions of a television set employing radio receiver portions as shown in any of FIGS. 1–8. In the DTV portion of the receiver, the data recovered in serial-bit form by the symbol decoder 11 are supplied to a data interleaver 50, which supplies interleaved data in parallel-bit form to trellis decoder circuitry 51. The trellis decoder circuitry 51 supplies output signal in parallel-bit form to a data de-interleaver 52, and the output signal from the data de-interleaver 52 are parsed into bytes by parsing, circuitry 53 for application to decoder circuitry 54 for decoding Reed-Solomon forward error-correction coding. The output signal from the Reed-Solomon decoder circuitry 54 is supplied to a data de-randomizer 55 which supplies packets of data to a packet sorter 56. The packet sorter 56 selects packets of video data to an MPEG-2 decoder 57, which supplies a digital luminance (Y) signal and digital chrominance (U and V) signals to video source chooser circuitry 58 in delayed response to those packets of video data. Further, the packet sorter 56 selects packets of audio data to a digital audio decoder 59, which generates digital stereophonic audio signals supplied to digital-to-audio converters (DACs) 60 and 61. The DACs 60 and 61 convert the digital stereophonic audio signals to analog stereophonic audio signals supplied to audio source chooser circuitry 62. The output signal from the equalizer 13 is supplied to ATSC sync separation circuitry 63 for detecting code groups specifying the beginnings of data fields and of data segments in the datastream.

The signals the ATSC sync separation circuitry 63 produces at the beginnings of the data fields are supplied to a controller 64 via a connection 65 and the signals the ATSC sync separation circuitry 63 produces at the beginnings of the data segments are supplied to the controller 64 via a connection 66. The controller 64 supplies a signal applied via a connection 67 to the video source chooser circuitry 58 for controlling its selection of video source and applied via a connection 68 to the audio source chooser circuitry 62 for controlling its selection of audio source. When DTV signal is being received, the controller 64 conditions the video source chooser circuitry 58 to select the digital luminance (Y) signal and digital chrominance (U and V) signals supplied by the MPEG-2 decoder 57 for application to a display buffer memory 69, the writing from which memory 69 is controlled by the controller 63 via a control link 70, and reading into which memory 69 is controlled by the controller 64 via a control link 71. When DTV signal is being received, the controller 64 conditions the audio source chooser circuitry 62 to select the analog stereophonic audio signals supplied by the DACs 60 and 61 for amplification by the audio amplifiers 72 and 73, which supply their respective amplifier responses to a left loudspeaker 74 and to a right loudspeaker 75. The controller 64 knows DTV signal is being received when the ATSC sync separation circuitry 63 detects the beginnings of the data fields in a DTV signal. Alternatively, circuitry for detecting the sustained presence of pilot carrier in a DTV signal being currently received can be used to inform the controller 64 of DTV signal reception.

The display buffer memory 69 is read from to supply raster-scanned digital luminance (Y) signal to a digital-to-analog converter 76 and digital chrominance (U and V) signals to digital-to-analog converters 77 and 78. The resulting analog luminance (Y) signal from the digital-to-analog converter 76 and analog chrominance (U and V) signals from the digital-to-analog converters 77 and 78 are supplied to color matrixing circuitry 79 of analog type to generate red, green and blue analog color signals amplified by amplifiers 80, 81 and 82, respectively. The amplified red, green and blue color signals are supplied to a display device 83, the raster scanning of which is controlled by the controller 64.

In TV receivers alternative to those diagrammed in FIG. 9, the raster-scanned digital luminance (Y) signal and digital chrominance (U and V) signals read from the display buffer memory 69 can be supplied to color matrixing circuitry of digital type to generate red, green and blue digital color signals that are then converted to red, green and blue analog color signals to be amplified by the amplifiers 80, 81 and 82, respectively.

In the analog TV portion of the receiver, the video detector 20 supplies composite video signal to NTSC sync separation circuitry 84, which supplies horizontal and vertical synchronization signals to the controller 64 via connections 85 and 86, respectively. The video detector 19 also supplies composite video signal to luminance/chrominance separation circuitry 87, which circuitry 87 separates an analog chrominance subcarrier signal for application to color circuitry 88 and separates an analog baseband luminance signal for application to an analog-to-digital converter 89. The color circuitry 88 receives a burst gate signal from the NTSC sync separation circuitry 84 via a connection 90 and responds to its input signals to supply a analog color-difference (U) signal to an analog-to-digital converter 91 and to supply another analog color-difference (V) signal to an analog-to-digital converter 92. The digitized luminance signal is supplied by the ADC 88 to a scan line doubler 93, which converts the 525 scan lines of NTSC luminance to a luminance signal having 1050 scan lines. The scan line doubler 93, the ADC 91 and the ADC 92 supply digitized Y, U and V signals to the video source chooser circuitry 58, for selection to the display buffer memory 69 when the controller 64 determines that an NTSC signal is currently being received and that no DTV signal is currently being received. The FM detector 27 supplies composite audio signal to a stereophonic decoder 94, which responds to composite audio signal for supplying stereophonic signals to the audio source chooser circuitry 62. The controller 64 receives the NTSC/ATSC CONTROL signal from the threshold detector 29 and uses it to determine whether or not an NTSC signal is currently being received. When the controller 64 determines that an NTSC signal is currently being received and that no DTV signal is currently being received, the controller 64 conditions the audio source chooser circuitry 62 to supply the audio amplifiers 72 and 73 stereophonic signals responsive to those from the stereophonic decoder 94.

FIG. 9 shows a video recorder 95 being included in combination with the TV set, forming what is known in the industry as a "combo". FIG. 9 shows the analog stereophonic audio signals from the audio source chooser circuitry 62 and the analog baseband luminance and baseband chrominance signals from the DACs 76, 77 and 78 being supplied to the video recorder 95, there to be digitized again by the video recorder 95 if it is a digital rather than an analog video recorder. The arrangement of video recorder 95 permits recording of NTSC signals as well as DTV signals, which is not possible with a digital video tape recorder arranged to record packets of digital television information before decoding by the MPEG-2 video decoder 57 and the digital audio decoder 59. There are, of course, embodiments of the invention in which the elements 72–75 and 79–83 are dispensed with.

DTV receivers that receive QAM DTV signals used in cablecasting as well as VSB DTV signals used for terrestrial through-the-air broadcasting are described by C. B. Patel and the inventor in U.S. Pat. No. 5,506,636 issued Apr. 9, 1996, entitled "HDTV SIGNAL RECEIVER WITH IMAGINARY—SAMPLE-PRESENCE DETECTOR FOR QAM/VSB MODE SELECTION". Where the SAW filter 4 is of a type having a substantially linear-phase, flat-amplitude response that has −1 dB to −1 dB bandwidth of 6 MHz the response of the IF amplifier 11 can be used to supply input signals to circuitry for synchrodyning QAM DTV signals to baseband, as well as to supply input signals to circuitry 12 for synchrodyning VSB DTV signals to baseband. Where the SAW filter 4 is of a type having a narrower bandwidth, so that FM NTSC sound carrier is trapped, the QAM DTV signals will require a parallel IF amplifier chain of their own and a SAW filter of the type having a substantially linear-phase, flat-amplitude response that has −1 dB to −1 dB bandwidth of 6 MHz for selecting the first detector 2 response as input signal to that separate IF amplifier chain. That separate IF amplifier chain can include a mixer that heterodynes an amplified UHF IF signal with oscillations from the second local oscillator 5 to generate a VHF IF signal.

In the claims which follow, the word "said" is used whenever reference is made to an antecedent, and the word "the" is used for grammatical purposes other than to refer back to an antecedent.

What is claimed is:

1. A radio receiver for selectively receiving one of a plurality of television signals in respective allocated transmission channels each of a prescribed bandwidth, some of which television signals are digital television signals, said radio receiver comprising:

a first detector which generates a first detector response to any television signal in one of said allocated transmission channels selected to be received, said first detector being of a type that translates the frequencies of the selected transmission channel to a range of intermediate frequencies of said prescribed bandwidth, which range of intermediate frequencies is above baseband and is substantially the same whether or not said any television signal in said selected transmission channel is a digital television signal;

first and second intermediate-frequency amplifier chains, each receptive of said first detector response as an input signal, said first intermediate-frequency amplifier chain supplying a first amplified very-high-frequency intermediate-frequency signal, and said second intermediate-frequency amplifier chain supplying a second amplified very-high-frequency intermediate-frequency signal;

synchrodyning circuitry for generating a baseband signal responsive to said first amplified very-high-frequency intermediate-frequency signal;

equalization filter circuitry for generating an equalized baseband signal responsive to said baseband signal;

a symbol decoder responsive to said equalized baseband signal for supplying data in serial-bit form when said selected one of said television signals is a digital television signal; and a video detector responsive to second amplified very-high-frequency intermediate-frequency signal for supplying a composite video signal when said selected one of said television signals is an analog television signal.

2. The radio receiver of claim I wherein said first detector is of a type which generates said first detector response in an ultra-high-frequency intermediate-frequency band above the ultra high frequencies assigned as television broadcasting channels.

3. The radio receiver of claim 2; wherein said first intermediate-frequency amplifier chain comprises the cascade connection of a first ultra-high-frequency intermediate-frequency amplifier for amplifying said first detector response to generate a first amplified ultra-high-frequency intermediate-frequency signal, a first downconverter for downconverting said first amplified ultra-high-frequency intermediate-frequency signal to generate a very-high-frequency first downconverter response, and a first very-high-frequency intermediate-frequency amplifier for amplifying said first downconverter response to generate said first amplified very-high-frequency intermediate-frequency signal; and wherein said second intermediate-frequency amplifier chain comprises the cascade connection of a second ultra-high-frequency intermediate-frequency amplifier for amplifying said first detector response to generate a second amplified ultra-high-frequency intermediate-frequency signal, a second downconverter for downconverting said second amplified ultra-high-frequency intermediate-frequency signal to generate a very-high-frequency second downconverter response, and a second very-high-frequency intermediate-frequency amplifier for amplifying said second downconverter response to generate said second very-high-frequency intermediate-frequency amplifier response.

4. The radio receiver of claim 3; wherein said first downconverter and said second downconverter together include a second local oscillator for generating ultra-high-frequency second local oscillations; wherein said first downconverter includes a respective second mixer for mixing said second local oscillations with said first amplified ultra-high-frequency intermediate-frequency signal to generate said very-high-frequency first downconverter response; and wherein said second downconverter includes a further respective second mixer for mixing said second local oscillations with said second amplified ultra-high-frequency intermediate-frequency signal to generate said very-high-frequency second downconverter response.

5. The radio receiver of claim 4, wherein said second local oscillator generates second local oscillations at a frequency below said ultra-high-frequency intermediate-frequency band.

6. The radio receiver of claim 4, wherein said second local oscillator generates second local oscillations at a frequency above said ultra-high-frequency intermediate-frequency band.

7. The radio receiver of claim 3; wherein said second very-high-frequency intermediate-frequency amplifier includes amplifier stages for providing controlled gain in response to an automatic gain control signal, at least an earlier of which amplifier stages employs forward automatic gain control so as to maintain low noise figure; said radio receiver further comprising:

automatic gain control circuitry for generating said automatic gain control signal in response to said composite video signal supplied from said video detector.

8. The radio receiver of claim 3; wherein said first very-high-frequency intermediate-frequency amplifier includes respective amplifier stages for providing controlled gain in response to a first automatic gain control signal, which respective amplifier stages employ reverse automatic gain control so as to exhibit linear gain; said radio receiver further comprising:

first automatic gain control circuitry for generating said first automatic gain control signal in response to a portion of said baseband signal generated by said synchrodyning circuitry.

9. The radio receiver of claim 8; wherein said second very-high-frequency intermediate-frequency amplifier includes respective amplifier stages for providing controlled gain in response to a second automatic gain control signal, at least an earlier of which respective amplifier stages employs forward automatic gain control so as to maintain low noise figure; said radio receiver further comprising:

second automatic gain control circuitry for generating said second automatic gain control signal in response to a portion of said composite video signal supplied from said video detector.

10. The radio receiver of claim 9, further comprising:

a first surface-acoustic-wave filter having a flat passband with steep-sloped rejection skirts and providing linear group delay for frequencies within said passband, said first surface-acoustic-wave filter included in said first intermediate-frequency amplifier chain for defining the overall bandwidth of said first intermediate-frequency amplifier chain by filtering said first amplified ultra-high-frequency intermediate-frequency signal prior to being supplied to said first downconverter for downconverting, the overall bandwidth of said first intermediate-frequency amplifier chain being such as to pass a digital television signal substantially in its entirety.

11. The radio receiver of claim 10, further comprising:

a second surface-acoustic-wave filter, providing a matched response for NTSC video signal in the region of its video carrier, included in said second intermediate-frequency amplifier chain for defining the overall bandwidth of said second intermediate-frequency amplifier chain by filtering said second amplified ultra-high-frequency intermediate-frequency signal prior to being supplied to said second downconverter for downconverting.

12. The radio receiver of claim 10, further comprising:

a second surface-acoustic-wave filter, providing a bandpass response for NTSC video signal, included in said second intermediate-frequency amplifier chain for defining the overall bandwidth of said second intermediate-frequency amplifier chain by filtering said second amplified ultra-high-frequency intermediate-frequency signal prior to being supplied to said second downconverter for downconverting, said second surface-acoustic-wave filter passing in-channel NTSC sound signal.

13. The radio receiver of claim 10, further comprising:

a bandpass filter for providing a narrowband response to a video carrier component appearing in said first amplified very-high-frequency intermediate-frequency signal when said selected one of said television signals is an analog television signal; and an automatic fine tuning detector responsive to the narrowband response of said bandpass filter for supplying an automatic fine tuning signal to said first detector when said selected one of said television signals is an analog television signal.

14. The radio receiver of claim 13, further comprising:

a second surface-acoustic-wave filter, providing a matched response for NTSC video signal in the region of its video carrier, included in said second intermediate-frequency amplifier chain for defining the overall bandwidth of said second intermediate-frequency amplifier chain by filtering said second amplified ultra-high-frequency intermediate-frequency signal prior to being supplied to said second downconverter for downconverting, said second surface-acoustic-wave filter passing in-channel frequency-modulated audio carrier;

a sound trap filter for applying said second very-high-frequency intermediate-frequency amplifier response to said video detector with frequency selectivity that suppresses frequency-modulated audio carrier;

an audio carrier selection filter for supplying response to frequency-modulated audio carrier in said second very-high-frequency intermediate-frequency amplifier response when said selected one of said television signals is an analog television signal;

a third mixer for multiplicatively mixing the response of said audio carrier selection filter with the response of said bandpass filter for generating an intercarrier sound signal when said selected one of said television signals is an analog television signal;

an intercarrier sound intermediate-frequency amplifier responsive to said intercarrier sound signal for supplying an amplified intercarrier sound signal; and a frequency-modulation detector for detecting said amplified intercarrier sound signal to reproduce a baseband sound signal.

15. The radio receiver of claim 10 further comprising:

a first bandpass filter for providing a narrowband response to a pilot carrier component appearing in said first amplified very-high-frequency intermediate-frequency signal when said selected one of said television signals is a digital television signal; and a first automatic fine tuning detector responsive to the narrowband response of said first bandpass filter for supplying a first automatic fine tuning signal to said first detector when said selected one of said television signals is a digital television signal.

16. The radio receiver of claim 15, further comprising:

a second bandpass filter for providing a narrowband response to a video carrier component appearing in said first amplified very-high-frequency intermediate-frequency signal when said selected one of said television signals is an analog television signal; and a second automatic fine tuning detector responsive to the narrowband response of said first bandpass filter for supplying a second automatic fine tuning signal to said first detector when said selected one of said television signals is an analog television signal.

17. The radio receiver of claim 16, further comprising:

a second surface-acoustic-wave filter, providing a matched response for NTSC video signal in the region of its video carrier, included in said second intermediate-frequency amplifier chain for defining the overall bandwidth of said second intermediate-frequency amplifier chain by filtering said second amplified ultra-high-frequency intermediate-frequency signal prior to being supplied to said second downconverter for downconverting, said second surface-acoustic-wave filter passing in-channel frequency-modulated audio carrier;

a sound trap filter for applying said second very-high-frequency intermediate-frequency amplifier response to said video detector with frequency selectivity that suppresses frequency-modulated audio carrier;

an audio carrier selection filter for supplying response to said in-channel frequency-modulated audio carrier that appears in said second very-high-frequency intermediate-frequency amplifier response when said selected one of said television signals is an analog television signal;

a third mixer for multiplicatively mixing the response of said audio carrier selection filter with the response of said second bandpass filter for generating an intercarrier sound signal when said selected one of said television signals is an analog television signal;

an intercarrier sound intermediate-frequency amplifier responsive to said intercarrier sound signal for supplying an amplified intercarrier sound signal; and a frequency-modulation detector for detecting said amplified intercarrier sound signal to reproduce a baseband sound signal.

18. The radio receiver of claim 17, further comprising:

circuitry detecting when the amplitude of said amplified intercarrier sound signal exceeds a prescribed value for generating an indication that said selected one of said television signals is an analog television signal; and an automatic fine tuning signal selector responsive to the absence of said indication for applying said first automatic fine tuning signal to said first detector and responsive to the presence of said indication for applying said second automatic fine tuning signal to said first detector.

19. The radio receiver of claim 16, further comprising a second surface-acoustic-wave filter, providing a bandpass response for NTSC video signal, included in said second intermediate-frequency amplifier chain for defining the overall bandwidth of said second intermediate-frequency amplifier chain by filtering said second amplified ultra-high-frequency intermediate-frequency signal prior to being supplied to said second downconverter for downconverting, said second surface-acoustic-wave filter passing in-channel frequency-modulated audio carrier;

a third surface-acoustic-wave filter, trapping said in-channel frequency-modulated audio carrier and providing a matched response for NTSC video signal in the region of its video carrier, included in said second intermediate-frequency amplifier chain for defining the overall bandwidth of said second intermediate-frequency amplifier chain by filtering said second amplified very-high-frequency intermediate-frequency signal prior to being supplied to said video detector;

an audio carrier selection filter for supplying response to frequency-modulated audio carrier in said second very-high-frequency intermediate-frequency amplifier response when said selected one of said television signals is an analog television signal;

a third mixer for multiplicatively mixing the response of said audio carrier selection filter with the response of said second bandpass filter for generating an intercarrier sound signal when said selected one of said television signals is an analog television signal;

an intercarrier sound intermediate-frequency amplifier responsive to said intercarrier sound signal for supplying an amplified intercarrier sound signal; and a frequency-modulation detector for detecting said amplified intercarrier sound signal to reproduce a baseband sound signal.

20. The radio receiver of claim 19, further comprising:

circuitry detecting when the amplitude of said amplified intercarrier sound signal exceeds a prescribed value for generating an indication that said selected one of said television signals is an analog television signal; and an automatic fine tuning signal selector responsive to the absence of said indication for applying said first automatic fine tuning signal to said first detector and responsive to the presence of said indication for applying said second automatic fine tuning signal to said first detector.

21. The radio receiver of claim 14, further comprising:

a second bandpass filter for providing a narrowband response to a video carrier component appearing in said second amplified very-high-frequency intermediate-frequency signal when said selected one of said television signals is an analog television signal; and a second automatic fine tuning detector responsive to the narrowband response of said first bandpass filter for supplying a second automatic fine tuning signal to said first detector when said selected one of said television signals is an analog television signal.

22. The radio receiver of claim 21, further comprising:

a second surface-acoustic-wave filter, providing a bandpass response for NTSC video signal, included in said second intermediate-frequency amplifier chain for defining the overall bandwidth of said second intermediate-frequency amplifier chain by filtering said second amplified ultra-high-frequency intermediate-frequency signal prior to being supplied to said second downconverter for downconverting, said second surface-acoustic-wave filter passing in-channel frequency-modulated audio carrier;

a third surface-acoustic-wave filter, trapping said in-channel frequency-modulated audio carrier and providing a matched response for NTSC video signal in the region of its video carrier, included in said second intermediate-frequency amplifier chain for defining the overall bandwidth of said second intermediate-frequency amplifier chain by filtering said second amplified very-high-frequency intermediate-frequency signal prior to being supplied to said video detector;

an audio carrier selection filter for supplying response to frequency-modulated audio carrier in said second very-high-frequency intermediate-frequency amplifier response when said selected one of said television signals is an analog television signal;

a third mixer for multiplicatively mixing the response of said audio carrier selection filter with the response of said second bandpass filter for generating an intercarrier sound signal when said selected one of said television signals is an analog television signal;

an intercarrier sound intermediate-frequency amplifier responsive to said intercarrier sound signal for supplying an amplified intercarrier sound signal; and a frequency-modulation detector for detecting said amplified intercarrier sound signal to reproduce a baseband sound signal.

23. The radio receiver of claim 22, further comprising:

circuitry detecting when the amplitude of said amplified intercarrier sound signal exceeds a prescribed value for generating an indication that said selected one of said television signals is an analog television signal; and an automatic fine tuning signal selector responsive to the absence of said indication for applying said first automatic fine tuning signal to said first detector and responsive to the presence of said indication for applying said second automatic fine tuning signal to said first detector.

24. The radio receiver of claim 3, further comprising:

a third intermediate-frequency amplifier chain receptive of said first detector response as an input signal, said third intermediate-frequency amplifier chain supplying a third amplified very-high-frequency intermediate-frequency signal; and sound signal reproduction circuitry for reproducing a baseband sound signal from said third amplified very-high-frequency intermediate-frequency signal.

25. The radio receiver of claim 24; wherein said second intermediate-frequency amplifier chain and said third intermediate-frequency amplifier chain include in common said second ultra-high-frequency intermediate-frequency amplifier for amplifying said first detector response to generate a second amplified ultra-high-frequency intermediate-frequency signal; and wherein said third intermediate-frequency amplifier chain further comprises, in cascade connection after said second ultra-high-frequency intermediate-frequency amplifier:

a third downconverter for downconverting said second amplified ultra-high-frequency intermediate-frequency signal to generate a very-high-frequency third downconverter response, and a third very-high-frequency intermediate-frequency amplifier for amplifying said third downconverter response to generate said third amplified very-high-frequency intermediate-frequency signal.

26. The radio receiver of claim 25; wherein said first downconverter, said second downconverter and said third downconverter together include a second local oscillator for generating ultra-high-frequency second local oscillations; wherein said first downconverter includes a respective second mixer for mixing said second local oscillations with said first amplified ultra-high-frequency intermediate-frequency signal to generate said very-high-frequency first downconverter response; wherein said second downconverter includes a further respective second mixer for mixing said second local oscillations with said second amplified ultra-high-frequency intermediate-frequency signal to generate said very-high-frequency second downconverter response; and wherein said third downconverter includes a further respective second mixer for mixing said second local oscillations with said third amplified ultra-high-frequency intermediate-frequency signal to generate said very-high-frequency second downconverter response.

27. The radio receiver of claim 25; wherein said first very-high-frequency intermediate-frequency amplifier includes respective amplifier stages for providing controlled gain in response to a first automatic gain control signal, which amplifier stages employ reverse automatic gain control so as to exhibit linear gain; wherein said second very-high-frequency intermediate-frequency amplifier includes respective amplifier stages for providing controlled gain in response to a second automatic gain control signal, at least an earlier of which amplifier stages employs forward automatic gain control so as to maintain low noise figure; wherein said third very-high-frequency intermediate-frequency amplifier is similar in its construction to said second very-high-frequency intermediate-frequency amplifier and includes respective amplifier stages for providing controlled gain in response to said second automatic gain control signal; and wherein said radio receiver further comprises:

first automatic gain control circuitry for generating said first automatic gain control signal in response to a portion of said baseband signal generated by said synchrodyning circuitry; and second automatic gain control circuitry for generating said second automatic gain control signal in response to a portion of said composite video signal supplied from said video detector.

28. The radio receiver of claim 27, further comprising:

a first surface-acoustic-wave filter having a flat passband with steep-sloped rejection skirts and providing linear group delay for frequencies within said passband, said first surface-acoustic-wave filter included in said first intermediate-frequency amplifier chain for defining the overall bandwidth of said first intermediate-frequency amplifier chain by filtering said first amplified ultra-high-frequency intermediate-frequency signal prior to being supplied to said first downconverter for downconverting the overall bandwidth of said first intermediate-frequency amplifier chain being such as to pass a digital television signal substantially in its entirety;

a second surface-acoustic-wave filter, providing a bandpass response for NTSC video signal, included in said second intermediate-frequency amplifier chain for defining the overall bandwidth of said second intermediate-frequency amplifier chain by filtering said second amplified ultra-high-frequency intermediate-frequency signal prior to being supplied to said second downconverter for downconverting, said second surface-acoustic-wave filter passing in-channel frequency-modulated audio carrier;

a third surface-acoustic-wave filter, trapping said in-channel frequency-modulated audio carrier and providing a matched response for NTSC video signal in the region of its video carrier, included in said second intermediate-frequency amplifier chain for defining the overall bandwidth of said second intermediate-frequency amplifier chain by filtering said second amplified very-high-frequency intermediate-frequency signal prior to being supplied to said video detector;

an audio carrier selection filter for supplying response to frequency-modulated audio carrier in said third very-high-frequency intermediate-frequency amplifier response when said selected one of said television signals is an analog television signal;

a bandpass filter for providing a narrowband response to a video carrier component appearing in one of said first and said second amplified very-high-frequency intermediate-frequency signals when said selected one of said television signals is an analog television signal;

a third mixer for multiplicatively mixing the response of said audio carrier selection filter with the response of said bandpass filter for generating an intercarrier sound signal when said selected one of said television signals is an analog television signal;

an intercarrier sound intermediate-frequency amplifier responsive to said intercarrier sound signal for supplying an amplified intercarrier sound signal; and a frequency-modulation detector for detecting said amplified intercarrier sound signal to reproduce a baseband sound signal.

29. The radio receiver of claim 28, further comprising:

an automatic fine tuning detector responsive to the narrowband response of said bandpass filter for supplying an automatic fine tuning signal to said first detector when said selected one of said television signals is an analog television signal.

30. The radio receiver of claim 28, wherein said bandpass filter is connected for providing a narrowband response to a video carrier component appearing in said first amplified very-high-frequency intermediate-frequency signal when said selected one of said television signals is an analog television signal.

31. The radio receiver of claim 28, wherein said bandpass filter is connected for providing a narrowband response to a video carrier component appearing in said second amplified very-high-frequency intermediate-frequency signal when said selected one of said television signals is an analog television signal.

32. The radio receiver of claim 27, further comprising:

a first surface-acoustic-wave filter having a flat passband with steep-sloped rejection skirts and providing linear group delay for frequencies within said passband, said first surface-acoustic-wave filter included in said first intermediate-frequency amplifier chain for defining the overall bandwidth of said first intermediate-frequency amplifier chain by filtering said first amplified ultra-high-frequency intermediate-frequency signal prior to being supplied to said first downconverter for downconverting, the overall bandwidth of said first intermediate-frequency amplifier chain being such as to pass a digital television signal substantially in its entirety;

a second surface-acoustic-wave filter, providing a bandpass response for NTSC video signal, included in said second intermediate-frequency amplifier chain for defining the overall bandwidth of said second intermediate-frequency amplifier chain by filtering said second amplified ultra-high-frequency intermediate-frequency signal prior to being supplied to said second downconverter for downconverting, said second surface-acoustic-wave filter passing in-channel frequency-modulated audio carrier;

a third surface-acoustic-wave filter, trapping said in-channel frequency-modulated audio carrier and providing a matched response for NTSC video signal in the region of its video carrier, included in said second intermediate-frequency amplifier chain for defining the overall bandwidth of said second intermediate-frequency amplifier chain by filtering said second amplified very-high-frequency intermediate-frequency signal prior to being supplied to said video detector;

an audio carrier selection filter for supplying response to frequency-modulated audio carrier in said third very-high-frequency intermediate-frequency amplifier response when said selected one of said television signals is an analog television signal;

a first bandpass filter for providing a narrowband response to a pilot carrier component appearing in said first amplified very-high-frequency intermediate-frequency signal when said selected one of said television signals is a digital television signal;

a first automatic fine tuning detector responsive to the narrowband response of said first bandpass filter for supplying a first automatic fine tuning signal to said first detector when said selected one ol said television signals is a digital television signal;

a second bandpass filter for providing a narrowband response to a video carrier component appearing in one of said first and said second amplified very-highfrequency intermediate-frequency signals when said selected one of said television signals is an analog television signal;

a second automatic fine tuning detector responsive to the narrowband response of said first bandpass filter for supplying a second automatic fine tuning signal to said first detector when said selected one of said television signals is an analog television signal;

a third mixer for multiplicatively mixing the response of said audio carrier selection filter with the response of said second bandpass filter for generating an intercarrier sound signal when said selected one of said television signals is an analog television signal;

an intercarrier sound intermediate-frequency amplifier responsive to said intercarrier sound signal for supplying an amplified intercarrier sound signal; and a frequency-modulation detector for detecting said amplified intercarrier sound signal to reproduce a baseband sound signal.

33. The radio receiver of claim 32, wherein said second bandpass filter is connected for providing a narrowband response to a video carrier component appearing in said first amplified very-high-frequency intermediate-frequency signal when said selected one of said television signals is an analog television signal.

34. The radio receiver of claim 32, wherein said second bandpass filter is connected for providing a narrowband response to a video carrier component appearing in said second amplified very-high-frequency intermediate-frequency signal when said selected one of said television signals is an analog television signal.

35. The radio receiver of claim 24; wherein said third intermediate-frequency amplifier chain comprises:

a third ultra-high-frequency intermediate-frequency amplifier for amplifying said first detector response to generate a third amplified ultra-high-frequency intermediate-frequency signal;

a third downconverter for downconverting said third amplified ultra-high-frequency intermediate-frequency signal to generate a very-high-frequency third downconverter response, and a third very-high-frequency intermediate-frequency amplifier for amplifying said third downconverter response to generate said third amplified very-high-frequency intermediate-frequency signal.

36. The radio receiver of claim 35; wherein said first downconverter, said second downconverter and said third downconverter together include a second local oscillator for generating ultra-high-frequency second local oscillations; wherein said first downconverter includes a respective second mixer for mixing said second local oscillations with said first amplified ultra-high-frequency intermediate-frequency signal to generate said very-high-frequency first downconverter response; wherein said second downconverter includes a further respective second mixer for mixing said second local oscillations with said second amplified ultra-high-frequency intermediate-frequency signal to generate said very-high-frequency second downconverter response; and wherein said third downconverter includes a further respective second mixer for mixing said second local oscillations with said third amplified ultra-high-frequency intermediate-frequency signal to generate said very-high-frequency second downconverter response.

37. The radio receiver of claim 35; wherein said first very-high-frequency intermediate-frequency amplifier includes respective amplifier stages for providing controlled gain in response to a first automatic gain control signal, which amplifier stages employ reverse automatic gain control so as to exhibit linear gain; wherein said second very-high-frequency intermediate-frequency amplifier includes respective amplifier stages for providing controlled gain in response to a second automatic gain control signal, at least an earlier of which amplifier stages employs forward automatic gain control so as to maintain low noise figure; wherein said third very-high-frequency intermediate-frequency amplifier is similar in its construction to said second very-high-frequency intermediate-frequency amplifier and includes respective amplifier stages for providing controlled gain in response to said second automatic gain control signal; and wherein said radio receiver further comprises:

first automatic gain control circuitry for generating said first automatic gain control signal in response to a portion of said baseband signal generated by said synchrodyning circuitry, and second automatic gain control circuitry for generating said second automatic gain control signal in response to a portion of said composite video signal supplied from said video detector.

38. The radio receiver of claim 37, further comprising:

a first surface-acoustic-wave filter having a flat passband with steep-sloped rejection skirts and providing linear group delay for frequencies within said passband, said first surface-acoustic-wave filter included in said first intermediate-frequency amplifier chain for defining the overall bandwidth of said first intermediate-frequency amplifier chain by filtering said first amplified ultra-high-frequency intermediate-frequency signal prior to being supplied to said first downconverter for downconverting, the overall bandwidth of said first intermediate-frequency amplifier chain being such as to pass a digital television signal substantially in its entirety;

a second surface-acoustic-wave filter, providing a matched response for NTSC video signal in the region of its video carrier, included in said second intermediate-frequency amplifier chain for defining the overall bandwidth of said second intermediate-frequency amplifier chain by filtering said second amplified ultra-high-frequency intermediate-frequency signal prior to being supplied to said second downconverter for downconverting, said second surface-acoustic-wave filter blocking in-channel frequency-modulated audio carrier;

a third surface-acoustic-wave filter, providing a double-humped frequency-selective response to NTSC signal with respective peaks of response near the video carrier frequency and the audio carrier frequency included in said third intermediate-frequency amplifier chain for defining the overall bandwidth of said third intermediate-frequency amplifier chain by filtering said third amplified ultra-high-frequency intermediate-frequency signal prior to being supplied to said third downconverter for downconverting;

an intercarrier sound detector responsive to said third amplified very-high-frequency intermediate-frequency signal for generating an intercarrier sound signal when said selected one of said television signals is an analog television signal;

an intercarrier sound intermediate-frequency amplifier responsive to said intercarrier sound signal for supplying an amplified intercarrier sound signal; and a frequency-modulation detector for detecting said amplified intercarrier sound signal to reproduce a baseband sound signal.

39. The radio receiver of claim 38, further comprising:

a first bandpass filter for providing a narrowband response to a pilot carrier component appearing in said first amplified very-high-frequency intermediate-frequency signal when said selected one of said television signals is a digital television signal;

a first automatic fine tuning detector responsive to the narrowband response of said first bandpass filter for supplying a first automatic fine tuning when said selected one of said television signals is a digital television signal;

a second bandpass filter tor providing a narrowband response to a video carrier component appearing in one of said first and said second amplified very-high-frequency intermediate-frequency signals when said selected one of said television signals is an analog television signal;

a second automatic fine tuning detector responsive to the narrowband response of said first bandpass filter for supplying a second automatic fine tuning signal when said selected one of said television signals is an analog television signal;

circuitry detecting when the amplitude of said amplified intercarrier sound signal exceeds a prescribed value for generating an indication that said selected one of said television signals is an analog television signal; and an automatic fine tuning signal selector responsive to the absence of said indication for applying said first automatic fine tuning signal to said first detector and responsive to the presence of said indication for applying said second automatic fine tuning signal to said first detector.

40. The radio receiver of claim 24; wherein said first intermediate-frequency amplifier chain and said third intermediate-frequency amplifier chain include in common said first ultra-high-frequency intermediate-frequency amplifier for amplifying said first detector response to generate a first amplified ultra-high-frequency intermediate-frequency signal; and wherein said third intermediate-frequency amplifier chain further comprises, in cascade connection after said first ultra-high-frequency intermediate-frequency amplifier:

a third downconverter for downconverting said first amplified ultra-high-frequency intermediate-frequency signal to generate a very-high-frequency third downconverter response, and a third very-high-frequency intermediate-frequency amplifier for amplifying said third downconverter response to generate said third amplified very-high-frequency intermediate-frequency signal.

41. The radio receiver of claim 40; wherein said first downconverter, said second downconverter and said third downconverter together include a second local oscillator for generating ultra-high-frequency second local oscillations; wherein said first downconverter includes a respective second mixer for mixing said second local oscillations with said first amplified ultra-high-frequency intermediate-frequency signal to generate said very-high-frequency first downconverter response; wherein said second downconverter includes a further respective second mixer for mixing said second local oscillations with said second amplified ultra-high-frequency intermediate-frequency signal to generate said very-high-frequency second downconverter response; and wherein said third downconverter includes a further respective second mixer for mixing said second local oscillations with said third amplified ultra-high-frequency intermediate-frequency signal to generate said very-high-frequency second downconverter response.

42. The radio receiver of claim 40; wherein said first very-high-frequency intermediate-frequency amplifier includes respective amplifier stages for providing controlled gain in response to a first automatic gain control signal, which amplifier stages employ reverse automatic gain control so as to exhibit linear gain; wherein said second very-high-frequency intermediate-frequency amplifier includes respective amplifier stages for providing controlled gain in response to a second automatic gain control signal, at least an earlier of which amplifier stages employs forward automatic gain control so as to maintain low noise figure; wherein said third very-high-frequency intermediate-frequency amplifier is similar in its construction to said second very-high-frequency intermediate-frequency amplifier and includes respective amplifier stages for providing controlled gain in response to said second automatic gain control signal; and wherein said radio receiver further comprises:

first automatic gain control circuitry for generating said first automatic gain control signal in response to a portion of said baseband signal generated by said synchrodyning circuitry; and second automatic gain control circuitry for generating said second automatic gain control signal in response to a portion of said composite video signal supplied from said video detector.

43. The radio receiver of claim 42, further comprising:

a first surface-acoustic-wave filter having a flat passband with steep-sloped rejection skirts and providing linear group delay for frequencies within said passband, said first surface-acoustic-wave filter included in said first intermediate-frequency amplifier chain for defining the overall bandwidth of said first intermediate-frequency amplifier chain by filtering said first amplified ultra-high-frequency intermediate-frequency signal prior to being supplied to said first downconverter for downconverting, the overall bandwidth of said first intermediate-frequency amplifier chain being such as to pass a digital television signal substantially in its entirety;

a second surface-acoustic-wave filter, providing a matched response for NTSC video signal in the region of its video carrier, included in said second intermediate-frequency amplifier chain for defining the overall bandwidth of said second intermediate-frequency amplifier chain by filtering said second amplified ultra-high-frequency intermediate-frequency signal prior to being supplied to said second downconverter for downconverting, said second surface-acoustic-wave filter blocking in-channel frequency-modulated audio carrier;

a third surface-acoustic-wave filter, providing a double-humped frequency-selective response to NTSC signal with respective peaks of response near the video carrier frequency and the audio carrier frequency included in said third intermediate-frequency amplifier chain for defining the overall bandwidth of said third intermediate-frequency amplifier chain by filtering said third amplified very-high-frequency intermediate-frequency signal;

an intercarrier sound detector responsive to said third amplified very-high-frequency intermediate-frequency signal as filtered by said third surface-acoustic-wave filter for generating an intercarrier sound signal when said selected one of said television signals is an analog television signal;

an intercarrier sound intermediate-frequency amplifier responsive to said intercarrier sound signal for supplying an amplified intercarrier sound signal; and a frequency-modulation detector for detecting said amplified intercarrier sound signal to reproduce a baseband sound signal.

44. The radio receiver of claim 43, further comprising:

a first bandpass filter for providing a narrowband response to a pilot carrier component appearing in said first amplified very-high-frequency intermediate-frequency signal when said selected one of said television signals is a digital television signal;

a first automatic fine tuning detector responsive to the narrowband response of said first bandpass filter for supplying a first automatic fine tuning when said selected one of said television signals is a digital television signal;

a second bandpass filter for providing a narrowband response to a video carrier component appearing in one of said first and said second amplified very-high-frequency intermediate-frequency signals when said selected one of said television signals is an analog television signal;

a second automatic fine tuning detector responsive to the narrowband response of said first bandpass filter for supplying a second automatic fine tuning signal when said selected one of said television signals is an analog television signal;

circuitry detecting when the amplitude of said amplified intercarrier sound signal exceeds a prescribed value for generating an indication that said selected one of said television signals is an analog television signal; and an automatic fine tuning signal selector responsive to the absence of said indication for applying said first automatic fine tuning signal to said first detector and responsive to the presence of said indication for applying said second automatic fine tuning signal to said first detector.

45. The radio receiver of claim 1; wherein said first intermediate-frequency amplifier chain includes respective amplifier stages for providing controlled gain in response to a first automatic gain control signal, which respective amplifier stages employ reverse automatic gain control so as to exhibit linear gain; wherein said second intermediate-frequency amplifier chain includes respective amplifier stages for providing controlled gain in response to a second automatic gain control signal, at least an earlier of which respective amplifier stages employs forward automatic gain control so as to maintain low noise figure; and wherein said radio receiver further comprises:

first automatic gain control circuitry for generating said first automatic gain control signal in response to a portion of said baseband signal generated by said synchrodyning circuitry; and second automatic gain control circuitry for generating said second automatic gain control signal in response to a portion of said composite video signal supplied from said video detector.

46. The radio receiver of claim 1; wherein said first intermediate-frequency amplifier chain includes respective amplifier stages for providing controlled gain in response to a first automatic gain control signal, which respective amplifier stages employ reverse automatic gain control so as to exhibit linear gain; wherein said second intermediate-frequency amplifier chain includes respective amplifier stages for providing controlled gain in response to a second automatic gain control signal, at least an earlier of which respective amplifier stages employs forward automatic gain control so as to maintain low noise figure; and wherein said radio receiver further comprises:

a radio-frequency amplifier for amplifying said selected one of said television signals for application to said first detector said radio-frequency amplifier provided with delayed reverse automatic gain control responsive to a third automatic gain control signal first automatic gain control circuitry for generating said first automatic gain control signal in response to a portion of said baseband signal generated by said synchrodyning circuitry and for generating said third automatic gain control signal in further response to said portion of said baseband signal generated by said synchrodyning circuitry when said selected one of said television signals is a digital television signal; and second automatic gain control circuitry for generating said second automatic gain control signal in response to a portion of said composite video signal supplied from said video detector and for generating said third automatic gain control signal in further response to said portion of said composite video signal supplied from said video detector when said selected one of said television signals is an analog television signal.

47. The radio receiver of claim 46, further comprising:

a bandpass filter for providing a narrowband response to a video carrier component appearing in one of said first and second amplified very-high-frequency intermediate-frequency signals when said selected one of said television signals is an analog television signal;

an audio carrier selection filter for supplying response to said in-channel frequency-modulated audio carrier that appears in said second very-high-frequency intermediate-frequency amplifier response when said selected one of said television signals is an analog television signal;

a mixer for multiplicatively mixing the response of said audio carrier selection filter with the response of said bandpass filter for generating an intercarrier sound signal when said selected one of said television signals is an analog television signal;

an intercarrier sound intermediate-frequency amplifier responsive to said intercarrier sound signal for supplying an amplified intercarrier sound signal;

circuitry detecting when the amplitude of said amplified intercarrier sound signal exceeds a prescribed value for generating an indication that said selected one of said television signals is an analog television signal; and an automatic gain control signal selector responsive to the absence of said indication for selecting said third automatic gain control signal to said radio-frequency amplifier from said first automatic gain control circuitry and responsive to the presence of said indication for selecting said third automatic gain control signal to said radio-frequency amplifier from said second automatic gain control circuitry.

48. The radio receiver of claim 47, further comprising:

a frequency-modulation detector for detecting said amplified intercarrier sound signal to reproduce a baseband sound signal.

49. The radio receiver of claim 46, further comprising:

a bandpass filter for providing a narrowband response to a video carrier component appearing in one of said first and second amplified very-high-frequency intermediate-frequency signals when said selected one of said television signals is an analog television signal;

a third intermediate-frequency amplifier chain receptive of said first detector response as an input signal, said third intermediate-frequency amplifier chain including respective amplifier stages for providing controlled gain in response to said second automatic gain control signal and supplying a third amplified very-high-frequency intermediate-frequency signal;

a mixer for multiplicatively mixing said third amplified very-high-frequency intermediate-frequency signal with the response of said bandpass filter for generating an intercarrier sound signal when said selected one of said television signals is an analog television signal;

an intercarrier sound intermediate-frequency amplifier responsive to said intercarrier sound signal for supplying an amplified intercarrier sound signal;

circuitry detecting when the amplitude of said amplified intercarrier sound signal exceeds a prescribed value for generating an indication that said selected one of said television signals is an analog television signal; and an automatic gain control signal selector responsive to the absence of said indication for selecting said third automatic gain control signal to said radio-frequency amplifier from said first automatic gain control circuitry and responsive to the presence of said for selecting said third automatic gain control signal to said radio-frequency amplifier from said second automatic gain control circuitry.

50. The radio receiver of claim 49, further comprising:

a frequency-modulation detector for detecting said amplified intercarrier sound signal to reproduce a baseband sound signal.

51. The radio receiver of claim 49, wherein said second and said third intermediate-frequency amplifier chains each include a shared ultra-high-frequency intermediate-frequency amplifier.

52. The radio receiver of claim 49, wherein said second and said third intermediate-frequency amplifier chains include respective ultra-high-frequency intermediate-frequency amplifiers.

53. The radio receiver of claim 46, further comprising:

a third intermediate-frequency amplifier chain receptive of said first detector response as an input signal, said third intermediate-frequency amplifier chain including respective amplifier stages for providing controlled gain in response to said second automatic gain control signal and supplying a third amplified very-high-frequency intermediate-frequency signal;

filtering elements included in said third intermediate-frequency amplifier chain for causing said third amplified very-high-frequency intermediate-frequency signal to exhibit a double-humped frequency-selective response with respective peaks of response near the video carrier frequency and the audio carrier frequency;

an intercarrier sound detector responsive to said third amplified very-high-frequency intermediate-frequency signal for generating an intercarrier sound signal when said selected one ol said television signals is an analog television signal;

an intercarrier sound intermediate-frequency amplifier responsive to said intercarrier sound signal for supplying an amplified intercarrier sound signal;

circuitry detecting when the amplitude of said amplified intercarrier sound signal exceeds a prescribed value for generating an indication that said selected one of said television signals is an analog television signal; and an automatic gain control signal selector responsive to the absence of said indication for selecting said third automatic gain control signal to said radio-frequency amplifier from said first automatic gain control circuitry and responsive to the presence of said indication for selecting said third automatic gain control signal to said radio-frequency amplifier from said second automatic gain control circuitry.

54. The radio receiver of claim 53, further comprising:

a frequency-modulation detector for detecting said amplified intercarrier sound signal to reproduce a baseband sound signal.

55. The radio receiver of claim 53, wherein said first and said third intermediate-frequency amplifier chains include respective ultra-high-frequency intermediate-frequency amplifiers.

56. The radio receiver of claim 53, wherein said first and said third intermediate-frequency amplifier chains each include a shared ultra-high-frequency intermediate-frequency amplifier.

* * * * *